United States Patent
Cha et al.

(10) Patent No.: US 11,245,102 B2
(45) Date of Patent: *Feb. 8, 2022

(54) ORGANIC LIGHT-EMITTING DIODE DISPLAY INCLUDING A STORAGE CAPACITIVE PLATE AND A DRIVING VOLTAGE LINE FORMED ON THE SAME LAYER AND MANUFACTURING METHOD THEREOF

(71) Applicant: Samsung Display Co., Ltd., Yongin-si (KR)

(72) Inventors: Myoung Geun Cha, Seoul (KR); Jin Goo Jung, Seongnam-si (KR); Yoon Ho Khang, Yongin-si (KR); Se Mi Kim, Goyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/985,376

(22) Filed: Aug. 5, 2020

(65) Prior Publication Data

US 2020/0365834 A1    Nov. 19, 2020

Related U.S. Application Data

(60) Continuation of application No. 15/867,600, filed on Jan. 10, 2018, now Pat. No. 10,741,797, which is a
(Continued)

(30) Foreign Application Priority Data

Nov. 19, 2014   (KR) .................. 10-2014-0161932

(51) Int. Cl.
*H01L 51/56*    (2006.01)
*H01L 27/12*    (2006.01)
*H01L 27/32*    (2006.01)

(52) U.S. Cl.
CPC ............ *H01L 51/56* (2013.01); *H01L 27/124* (2013.01); *H01L 27/1222* (2013.01);
(Continued)

(58) Field of Classification Search
CPC ...................................... H01L 51/56
See application file for complete search history.

(56) References Cited

U.S. PATENT DOCUMENTS

| 9,899,634 B2 | 2/2018 | Cha et al. |
| 2002/0104995 A1 | 8/2002 | Yamazaki et al. |

(Continued)

FOREIGN PATENT DOCUMENTS

| KR | 10-0642491 | 10/2006 |
| KR | 10-2010-0049385 | 5/2010 |

(Continued)

*Primary Examiner* — Thao X Le
*Assistant Examiner* — Laura M Dykes
(74) *Attorney, Agent, or Firm* — F. Chau & Associates, LLC

(57) ABSTRACT

An OLED display and a method of manufacturing thereof are disclosed. In one aspect, the display includes a scan line formed over a substrate and configured to transfer a scan signal, a data line and a driving voltage line crossing the scan line and respectively configured to transfer a data voltage and a driving voltage, and a switching transistor electrically connected to the scan line and the data line and including a switching drain electrode configured to output the data voltage. The display also includes a driving transistor including a driving gate electrode, a driving drain electrode, and a driving source electrode electrically connected to the switching drain electrode. The display further includes a storage capacitor including a first storage electrode electrically connected to the driving gate electrode and a second storage electrode formed on the same layer as the driving voltage line.

14 Claims, 19 Drawing Sheets

Related U.S. Application Data division of application No. 14/708,049, filed on May 8, 2015, now Pat. No. 9,899,634.

(52) U.S. Cl.
CPC ...... *H01L 27/1255* (2013.01); *H01L 27/3276* (2013.01); *H01L 27/1225* (2013.01)

(56) References Cited

U.S. PATENT DOCUMENTS

| | | |
|---|---|---|
| 2003/0214006 A1 | 11/2003 | Nakamura et al. |
| 2004/0029338 A1 | 2/2004 | Yamazaki et al. |
| 2004/0256997 A1 | 12/2004 | Fukumoto et al. |
| 2005/0104814 A1 | 5/2005 | Choi et al. |
| 2005/0258771 A1 | 11/2005 | Kang et al. |
| 2006/0279499 A1* | 12/2006 | Park .................. G09G 3/3225 345/92 |
| 2009/0128018 A1* | 5/2009 | Lee .................... H01L 27/1251 313/504 |
| 2011/0128211 A1 | 6/2011 | Ono |
| 2012/0001885 A1 | 1/2012 | Kang et al. |
| 2013/0271440 A1 | 10/2013 | Jin et al. |
| 2014/0132584 A1 | 5/2014 | Kim |
| 2014/0239270 A1 | 8/2014 | Ko et al. |
| 2018/0159090 A1 | 6/2018 | Cha et al. |

FOREIGN PATENT DOCUMENTS

| | | |
|---|---|---|
| KR | 10-2011-0060474 | 6/2011 |
| KR | 10-2013-0069048 | 6/2013 |
| KR | 10-2014-0018623 | 2/2014 |
| KR | 10-2007-0076860 | 7/2017 |

* cited by examiner

ORGANIC LIGHT-EMITTING DIODE DISPLAY INCLUDING A STORAGE CAPACITIVE PLATE AND A DRIVING VOLTAGE LINE FORMED ON THE SAME LAYER AND MANUFACTURING METHOD THEREOF

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application is a continuation of U.S. patent application Ser. No. 15/867,600, filed on Jan. 10, 2018 in the U.S. Patent and Trademark Office, which is a divisional of U.S. patent application Ser. No. 14/708,049, filed on May 8, 2015 in the U.S. Patent and Trademark Office, which claims priority from and the benefit of Korean Patent Application No. 10-2014-0161932, filed in the Korean Intellectual Property Office on Nov. 19, 2014, the entire contents of all of which are incorporated herein by reference.

BACKGROUND

Technical Field

The described technology generally relates to an organic light-emitting diode display and a manufacturing method thereof.

Description of the Related Technology

An organic light-emitting diode (OLED) display includes two electrodes and an organic emission layer positioned therebetween. An electron injected from one electrode and a hole injected from the other electrode are combined in the organic emission layer to generate an exciton, and the exciton emits energy in the form of light.

An OLED display includes a matrix of pixels. In each pixel, a plurality of thin film transistors (TFTs) and at least one storage capacitor for driving the OLED are formed. The TFTs include a switching TFT and a driving TFT.

SUMMARY OF CERTAIN INVENTIVE ASPECTS

One inventive aspect is an OLED display and a manufacturing method thereof having advantages of changing a pixel structure of the OLED display to manufacture the OLED display by using at least one less mask.

Another aspect includes an OLED display including: a substrate; a scan line formed on the substrate and transmitting a scan signal; a data line and a driving voltage line crossing the scan line and respectively transmitting a data voltage and a driving voltage; a switching transistor connected to the scan line and the data line and including a switching drain electrode outputting the data voltage; a driving transistor including a driving source electrode connected to the switching drain electrode; a storage capacitor including a First storage electrode connected to a driving gale electrode of the driving transistor and a second storage electrode that is a part of the driving voltage line; and an OLED electrically connected to a driving drain electrode of the driving transistor.

The first storage electrode and the driving gate electrode can overlap each other.

A gate connecting member formed with the same layer as the scan line can be further included, the driving voltage line can include a first driving voltage line parallel to the data line and a second driving voltage line crossing the data line, the data line can include an upper data line and a lower data line separated from each other in a crossing portion crossing the second driving voltage line, and the gate connecting member can connect the upper data line and the lower data line to each other.

The gate connecting member can cross the second driving voltage line.

A semiconductor formed on the substrate and including a switching channel and a driving channel separated from each other, a first gate insulating layer covering the semiconductor, and a switching gate electrode and a driving gate electrode formed on the first gate insulating layer and respectively overlapping the switching channel and the driving channel can be further included, and the gate connecting member can be formed with the same layer as the switching gate electrode and the driving gate electrode.

The driving channel can have at least one curved portion.

A second gate insulating layer covering the switching gate electrode, the driving gate electrode, and the gate connecting member, an interlayer insulating layer covering the data line and the driving voltage line, and a passivation layer formed between the interlayer insulating layer and the OLED can be further included, and the data line and the driving voltage line can be formed between the second gate insulating layer and the interlayer insulating layer.

The first storage electrode and the driving gate electrode can be separated from each other in a plane.

A semiconductor formed on the substrate and including a switching channel and a driving channel separated from each other, a first gate insulating layer covering the semiconductor, a switching gate electrode and a driving gate electrode formed on the first gate insulating layer and respectively overlapping the switching channel and the driving channel, and a second gate insulating layer covering the switching gate electrode and the driving gate electrode can be further included, and a thickness of the second gate insulating layer positioned between the first storage electrode and the second storage electrode can be thinner than the thickness of the second gate insulating layer formed on the driving gate electrode.

An interlayer insulating layer covering the data line and the driving voltage line and a passivation layer formed between the interlayer insulating layer and the OLED can be further included, and the data line and the driving voltage line can be formed between the second gate insulating layer and the interlayer insulating layer.

Another aspect is a manufacturing method of an OLED display including: forming a semiconductor on a substrate; forming a first gate insulating layer on the semiconductor, forming a driving gate electrode, a switching gate electrode, and a gate connecting member on the first gate insulating layer; forming a second gate insulating layer covering the driving gate electrode and the switching gate electrode; simultaneously forming a data line including an upper data line and a lower data line separated from each other, a first driving voltage line parallel to the data line, and a second driving voltage line crossing the data line on the second gate insulating layer; forming an interlayer insulating layer covering the data line, the first driving voltage line, and the second driving voltage line; and forming an OLED on the interlayer insulating layer; wherein the gate connecting member connects the upper data line and the lower data line to each other.

Forming a passivation layer can be further included after forming the interlayer insulating layer.

A storage capacitor can be formed in a region where the driving gate electrode and an expansion region of the first driving voltage line overlap.

The driving channel can have at least one curved portion.

Another aspect is an organic light-emitting diode (OLED) display comprising a substrate, a scan line formed over the substrate and configured to transfer a scan signal, a data line and a driving voltage line crossing the scan line and respectively configured to transfer a data voltage and a driving voltage, and a switching transistor electrically connected to the scan line and the data line and including a switching drain electrode configured to output the data voltage. The display also includes a driving transistor including a driving gate electrode, a driving drain electrode, and a driving source electrode electrically connected to the switching drain electrode. The display further includes a storage capacitor including a first storage electrode electrically connected to the driving gate electrode and a second storage electrode formed on the same layer as the driving voltage line. Furthermore, the display includes an OLED electrically connected to the driving drain electrode.

In the above display, the first storage electrode and the driving gate electrode at least partially overlap each other.

The above display further comprises a gate connecting member formed on the same layer as the scan line, wherein the driving voltage line includes a first driving voltage line substantially parallel to the data line and a second driving voltage line crossing the data line, wherein the data line includes an upper data line and a tower data line separated from the upper data line, and wherein the gate connecting member is configured to electrically connect the upper data line to the lower data line.

In the above display, the gate connecting member crosses the second driving voltage line.

The above display further comprises a semiconductor layer formed over the substrate and including a switching channel and a driving channel separated from each other, a first gate insulating layer at least partially covering the semiconductor layer, and a switching gate electrode and a driving gate electrode formed over the first gate insulating layer and at least partially overlapping the switching channel and the driving channel, respectively, wherein the gate connecting member is formed on the same layer as the switching gate electrode and the driving gate electrode.

In the above display, the driving channel has at least one curved portion.

The above display further comprises a second gate insulating layer at least partially covering the switching gate electrode, the driving gate electrode, and the gate connecting member. The above display further comprises an interlayer insulating layer at least partially covering the data line and the driving voltage line and a passivation layer formed between the interlayer insulating layer and the OLED, wherein the data line and the driving voltage line are formed between the second gate insulating layer and the interlayer insulating layer.

In the above display, the first storage electrode and the driving gate electrode are separated from each other.

The above display further comprises a semiconductor layer formed over the substrate and including a switching channel and a driving channel separated from each other and a first gate insulating layer at least partially covering the semiconductor layer. The above display further comprises a switching gate electrode and a driving gate electrode formed over the first gate insulating layer and at least partially overlapping the switching channel and the driving channel, respectively. The above display further comprises a second gate insulating layer at least partially-covering the switching gate electrode and the driving gate electrode, wherein a first thickness of the second gate insulating layer between the first and second storage electrodes is less than a second thickness of the second gate insulating layer formed over the driving gate electrode.

The above display further comprises an interlayer insulating layer at least partially covering the data line and the driving voltage line and a passivation layer formed between the interlayer insulating layer and the OLED, wherein the data line and the driving voltage line are formed between the second gate insulating layer and the interlayer insulating layer.

Another aspect is a method of manufacturing an organic light-emitting diode (OLED) display, comprising forming a semiconductor layer over a substrate, forming a first gate insulating layer over the semiconductor layer, aid forming a driving gate electrode, a switching gate electrode, and a gate connecting member over the first gate insulating layer. The method also comprises forming a second gate insulating layer at least partially covering the driving gate electrode and the switching gate electrode and substantially simultaneously forming i) a data line, including an upper data line and a lower data line separated from each other, ii) a first driving voltage line substantially parallel to the data line, and iii) a second driving voltage line crossing the data line, on the second gate insulating layer. The method further comprises forming an interlayer insulating layer at least partially covering the data line, the first driving voltage line, and the second driving voltage line. The method also comprises forming an OLED over the interlayer insulating layer, wherein the gate connecting member is configured to electrically connect the upper data line to the lower data line.

The above method further comprises forming a passivation layer after forming the interlayer insulating layer.

The above method further comprises forming a storage capacitor where the driving gate electrode and a portion of the first driving voltage line overlap.

In the above method, the driving channel has at least one curved portion.

In the above method, the storage capacitor includes a first storage electrode electrically connected to the driving gate electrode and a second storage electrode electrically connected to the driving voltage line, and wherein the data line, the driving voltage line, and the second storage electrode are formed using the same mask.

Another aspect is an organic light-emitting diode (OLED) display comprising a substrate, and a data line and a driving voltage line each formed over the substrate and configured to respectively transfer a data voltage and a driving voltage. The display also comprises a driving transistor including a driving drain electrode, a driving gate electrode electrically connected to the driving voltage line, and a driving source electrode electrically connected to the data line. The display also comprises a storage capacitor including a first storage electrode electrically connected to the driving gate electrode and a second storage electrode formed on the same layer and of the same material as the driving voltage line. The display further comprises an OLED electrically connected to the driving drain electrode.

The above display further comprises a gate connecting member formed over the substrate, wherein the driving voltage line includes a first driving voltage line substantially parallel to the data line and a second driving voltage line crossing the data line, wherein the data line includes an upper data line and a lower data line separated from the upper data line, and wherein the gate connecting member is configured to electrically connect the upper data line to the lower data line.

The above display further comprises a semiconductor layer formed over the substrate and including a switching channel and a driving channel separated from each other, a first gate insulating layer at least partially covering the semiconductor layer, and a switching gate electrode and a driving gate electrode formed over the first gate insulating layer and at least partially overlapping the switching channel and the driving channel, respectively, wherein the gate connecting member is formed on the same layer as the switching gate electrode and the driving gate electrode.

The above display further comprises a second gate insulating layer at least partially covering the switching gate electrode, the driving gate electrode, and the gate connecting member. The above display further comprises an interlayer insulating layer at least partially covering the data line and the driving voltage line and a passivation layer formed between the interlayer insulating layer and the OLED, wherein the data line and the driving voltage line are formed between the second gate insulating layer and the interlayer insulating layer.

The above display further comprises a semiconductor layer formed over the substrate and including a switching channel and a driving channel separated from each other. The above display further comprises a first gate insulating layer at least partially covering the semiconductor layer and a switching gate electrode and a driving gate electrode formed over the first gate insulating layer and at least partially overlapping the switching channel and the driving channel, respectively. The above display further comprises a second gate insulating layer at least partially covering the switching gate electrode and the driving gate electrode, wherein a first thickness of the second gate insulating layer between the first and second storage electrodes is less than a second thickness of the second gats insulating layer formed over the driving gate electrode.

According to at least one of the disclosed embodiments, the second storage capacitive plate is formed with the same layer and the same material as the driving voltage line and the data line such that at least one mask can be eliminated.

Further, the data line is divided into the upper data line and the lower data line to not be short-circuited to each other in the crossing portion of the data line and the second driving voltage line of the same layer, and the upper data line and the lower data line that are separated are connected through the gate connecting member, thereby forming the data line and the second driving voltage line at the same layer. Accordingly, the driving voltage line can be formed with a mesh structure by connecting the first driving voltage line of a vertical direction and the second driving voltage line of a horizontal direction to each other such that the voltage drop of the driving voltage ELVDD can be prevented.

In addition, the thickness of the second gate insulating layer positioned between the first storage electrode and the second storage electrode is thinner than the thickness of the second gate insulating layer on the other position such that the storage capacitance of the storage capacitor can be maximized.

DETAILED DESCRIPTION OF CERTAIN INVENTIVE EMBODIMENTS

Figure 1:
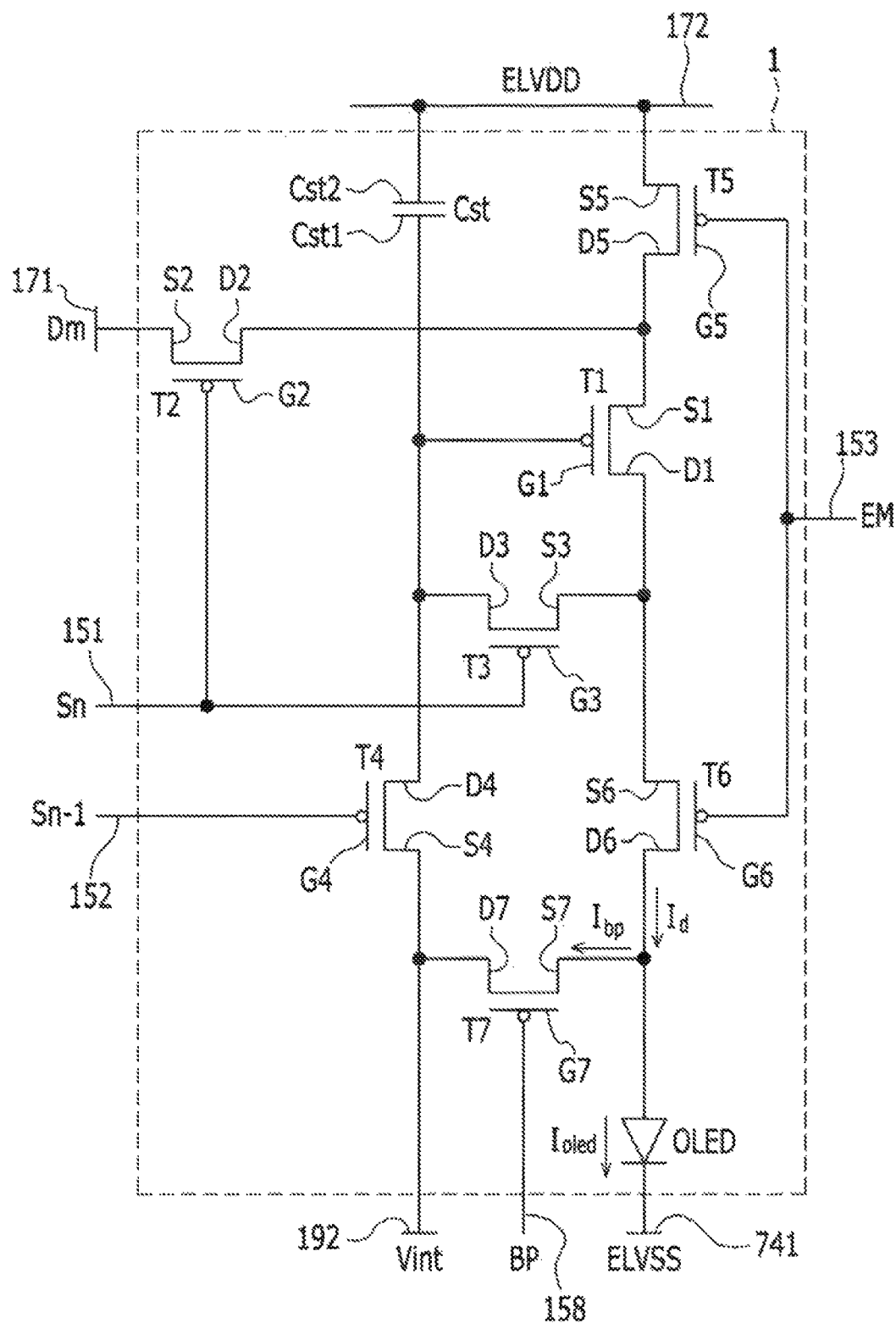
FIG. 1 is an equivalent circuit diagram of one pixel of an OLED display according to an exemplary embodiment.

Since TFTs and capacitors are formed by patterning in every OLED pixel, and an organic light-emitting layer is formed thereon, the manufacture of OLED displays typically uses many masks. This results in increased manufacturing costs.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

Parts irrelevant to a description are omitted to clearly illustrate the present disclosure, and like reference numbers designate like constituent elements through the specification.

In addition, the size and thickness of each configuration shown in the drawings are arbitrarily shown for better understanding and ease of description, but the present disclosure is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising" will be understood to imply the inclusion of stated elements but not the exclusion of any other elements. In addition, ".about.on" is either positioned on or below a portion of a target or positioned on the upper side based on a gravity direction, throughout the specification.

Further, in the specification, the word "in a plan view" means when an object portion is viewed from above, and the word "in cross-section" means when a cross-section taken by vertically cutting an object portion is viewed from the side. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Now, an OLED display according to an exemplary embodiment will be described with reference to FIG. 1 to FIG. 6.

FIG. 1 is an equivalent circuit diagram of one pixel of an OLED display according to an exemplary embodiment.

As illustrated in FIG. 1, one pixel 1 of the OLED display includes a plurality of signal lines 151, 152, 153, 158, 171, 172, and 192, a plurality of transistors T1, T2, T3, T4, T5, T6, and T7 connected to the signal lines, a storage capacitor Cst, and an OLED.

The transistors T1-T7 include a driving transistor T1, a switching transistor T2, a compensation transistor T3, an initialization transistor T4, an operation control transistor T5, a light emission control transistor T6, and a bypass transistor T7.

The signal lines 151, 152, 153 and 158 include a scan line 151 transferring a scan signal Sn, a previous scan line 152 transferring a previous scan signal S(n–1) to the initialization transistor T4, a light emission control line 153 transferring a light emission control signal EM to the operation control transistor T5 and the light emission control transistor T6, and a bypass control line 158 transferring a bypass signal BP to the bypass transistor T7. The signal lines 171, 172, and 192 include a data line 171 crossing the scan line 151 and transferring a data signal Dm, a driving voltage line 172 transferring a driving voltage ELVDD and formed to be substantially parallel with the data line 171, and an initialization voltage line 192 transferring an initialization voltage Vint initializing the driving transistor T1.

A gate electrode G1 of the driving transistor T1 is connected to one end Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm according to a switching operation of the switching transistor T2 to supply a driving current Id to the OLED.

A gate electrode G2 of the switching transistor T2 is connected to the scan line 121, a source electrode S2 of the switching transistor T2 is connected to the data line 171, and a drain electrode D2 of the switching transistor T2 is connected to the source electrode S1 and the driving voltage line 172 via the operation control transistor T5. The switching transistor T2 is turned on according to the scan signal Sn received through the scan line 121 to perform a switching operation of transferring the data signal Dm transferred to the data line 171 to the source electrode of the driving transistor T1.

A gate electrode G3 of the compensation transistor T3 is directly connected to the scan line 151, a source electrode S3 of the compensation transistor T3 is connected to the drain electrode D1 and an anode of the OLED via the emission control transistor T6, and a drain electrode D3 of the compensation transistor T3 is connected to the one end Cst1, the drain electrode D4, and the gate electrode G1. The compensation transistor T3 is turned on according to the scan signal Sn received through the scan line 151 to connect the gate electrode G1 to the drain electrode D1 and diode-connect the driving transistor T1.

A gate electrode G4 of the initialization transistor T4 is connected to the previous scan line 152, a source electrode S4 of the initialization transistor T4 is connected to the initialization voltage line 192, and a drain electrode D4 of the initialization transistor T4 is connected to the one end Cst1 and the gate electrode G1 through the drain electrode D3. The initialization transistor T4 is turned on according to the previous scan signal S(n–1) received through the previous scan line 152 to transfer the initialization voltage Vint to the gate electrode G1 to perform an initialization operation of initializing a voltage of the gate electrode G1.

A gate electrode G5 of the operation control transistor T5 is connected to the light emission control line 153, a source electrode S5 of the operation control transistor T5 is connected to the driving voltage line 172, and a drain electrode D5 of the operation control transistor T5 is connected to the source electrode Si and the drain electrode S2.

A gate electrode G6 of the emission control transistor T6 is connected to the light emission control line 153, the source electrode S6 is connected to the drain electrode D1 and the source electrode S3, and the drain electrode D6 is electrically connected to the anode of the OLED. The operation control transistor T5 and the first emission control transistor T6 are substantially simultaneously turned on according to the emission control signal EM transmitted to the emission control line 153 such that the driving voltage ELVDD is compensated through the diode-connected driving transistor T1 and is transmitted to the OLED.

A gate electrode G7 of the thin film bypass transistor T7 is connected to the bypass control line 158, a source electrode S7 of the bypass TFT T7 is connected to the drain electrode D6 and the anode of the OLED together, and a drain electrode D7 of the bypass TFT T7 is connected to the initialization voltage line 192 and the source electrode S4.

The other end Cst2 of the storage capacitor Cst is connected to the driving voltage line 172, and a cathode of the OLED is connected to a common voltage line 741 transferring a common voltage ELVSS.

Hereinafter, a detailed operation process of one pixel of the pixel unit of the OLED display according to an exemplary embodiment will be described in detail with reference to FIG. 2.

Figure 2:
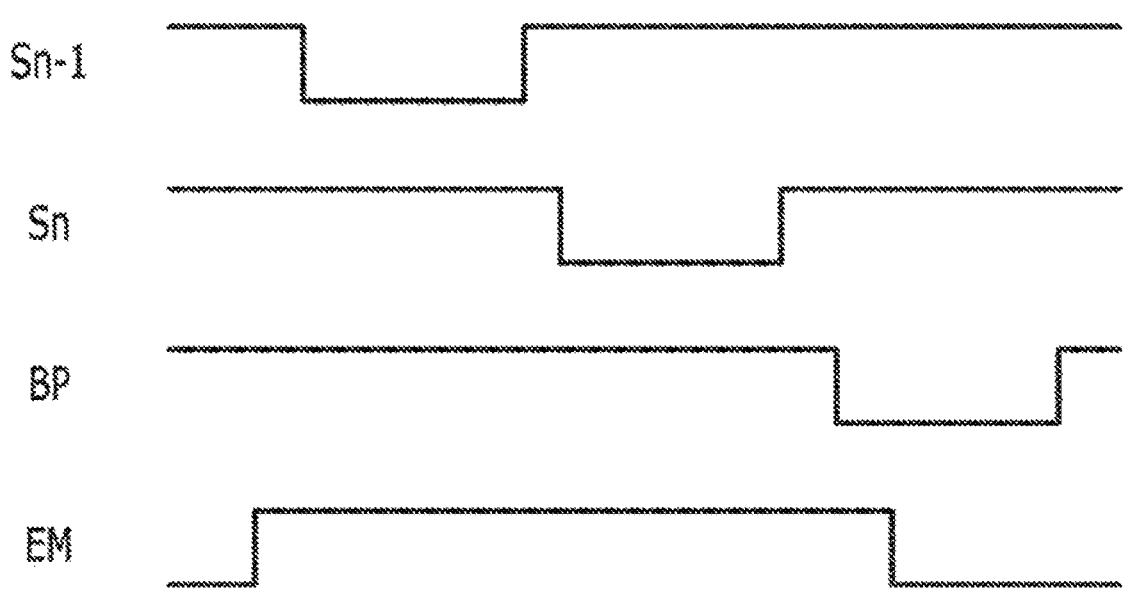
FIG. 2 is a timing diagram of a signal applied to one pixel in the OLED display according to the exemplary embodiment of FIG. 1.

As shown in FIG. 2, first, for an initializing period, the previous scan signal S(n–1) having a low level is supplied through the previous scan line 152. Then, the initializing TFT T4 is turned on in response to the previous scan signal S(n–1) having the low level, the initial voltage Vint is connected to the gate electrode G1 from the initialization voltage line 194 through the initializing TFT T4, and then the driving TFT T1 is initialized by the initialization voltage Vint.

Thereafter, for a data programming period, the scan signal Sn having a low level is supplied through the scan line 151. Then, the switching TFT T2 and the compensating TFT T3 are turned on in response to the scan signal Sn having the low level. At this time, the driving transistor T1 is diode-connected through the turned-on compensation transistor T3 and is forward biased.

Then, a compensation voltage Dm+Vth (Vth is a negative (−) value) reduced by a threshold voltage Vth of the driving TFT T1 from a data signal Dm supplied from the data line 171 is applied to the gate electrode G1. The driving voltage ELVDD and the compensation voltage (Dm+Vth) are applied to both terminals of the storage capacitor Cst, and a charge corresponding to a voltage difference between Doth terminals is stared in the storage capacitor Cst.

Next, during the emission period, the emission control signal EM supplied from the emission control line 153 is changed from the high level into the low level. Thus, the operation control transistor T5 and the emission control transistor T6 are turned on by the emission control signal EM of the low level during the emission period.

Thus, a driving current Id is generated according to the voltage difference between the gate voltage of the gate electrode G1 and the driving voltage ELVDD, and the driving current Id is supplied to the OLED through the emission control transistor T6. The gate-source voltage Vgs of the driving TFT T1 is maintained as "(Dm+Vth)−ELVDD" by the storage capacitor Cst for the emission period, and according to a current-voltage relationship of the driving TFT T1, the driving current Id is proportional to the square "(Dm−ELVDD).sup.2" of a value obtained by subtracting the threshold voltage from the source-gate voltage. Accordingly, the driving current Id is determined regardless of the threshold voltage Vth of the driving TFT T1.

In this case, the bypass transistor T7 is transmitted with the bypass signal BP from the bypass control line 158. Thus, a portion of the driving current Id is discharged as the bypass current Ibp through the bypass transistor T7.

When a minimum current of the driving transistor T1 displaying the black image flows as the driving current, if the OLED is also emitted, the black image is not normally displayed. Accordingly, the bypass transistor T7 of the OLED display according to an exemplary embodiment can disperse the portion of the minimum current of the driving transistor T1 as the bypass current Ibp through the other current path besides the current path of the OLED side. Here, the minimum current of the driving transistor T1 corresponds to the current in a condition when the driving transistor T1 is turned off and the gate-source voltage Vgs of the driving transistor T1 is less than the threshold voltage Vth. The minimum driving current (for example, a current of about 10 pA or less) under the condition in which the driving transistor T1 is turned off is transferred to the OLED to be expressed as an image with black luminance. When the minimum driving current expressing the black image flows, an influence on a bypass transfer of the bypass current Ibp is large, but when a large driving current expressing an image such as a normal image or a white image flows, there can be little influence on the bypass current Ibp. Accordingly, when the driving current displaying a black image flows, the light emission current Iholed of the OLED has a minimum current amount that can express the black image. Therefore, a black luminance image is implemented by using the bypass transistor T7, thereby improving a contrast ratio. In FIG. 2, the bypass signal BP is the same as a next scan signal S(n+1), but is not necessarily limited thereto. Also, in an exemplary embodiment, the structure of the seven transistors including the bypass transistor T7 and one capacitor is shown, however the described technology is not limited thereto.

Next, the detailed structure of the pixel of the OLED display shown in FIG. 1 will be described with reference to FIG. 3 to FIG. 6 as well as FIG. 1.

Figure 3:
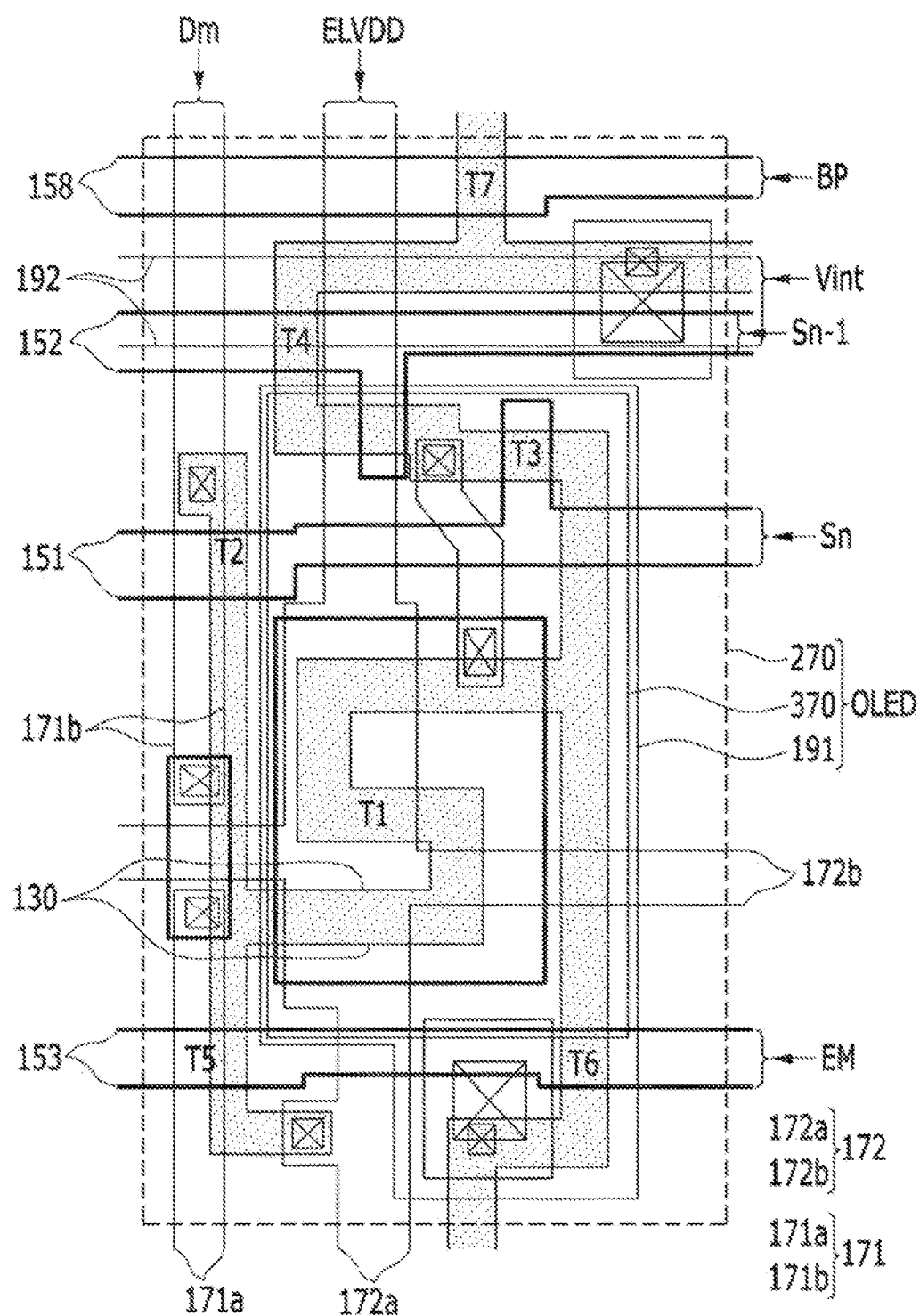
FIG. 3 is a schematic view of a plurality of transistors and a capacitor of an OLED display according to an exemplary embodiment.
Figure 4:
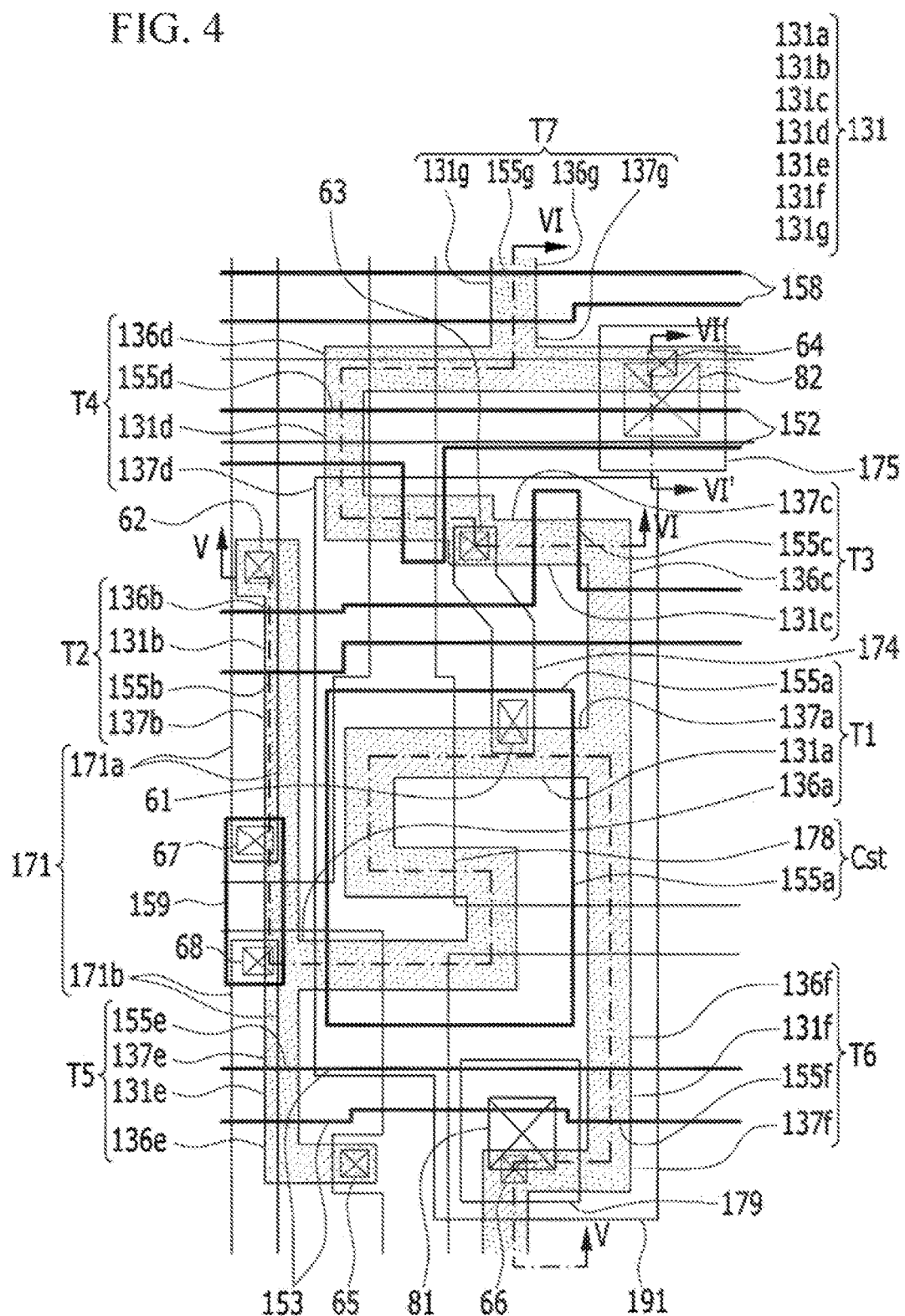
FIG. 4 is a detailed layout view of FIG. 3.
Figure 5:
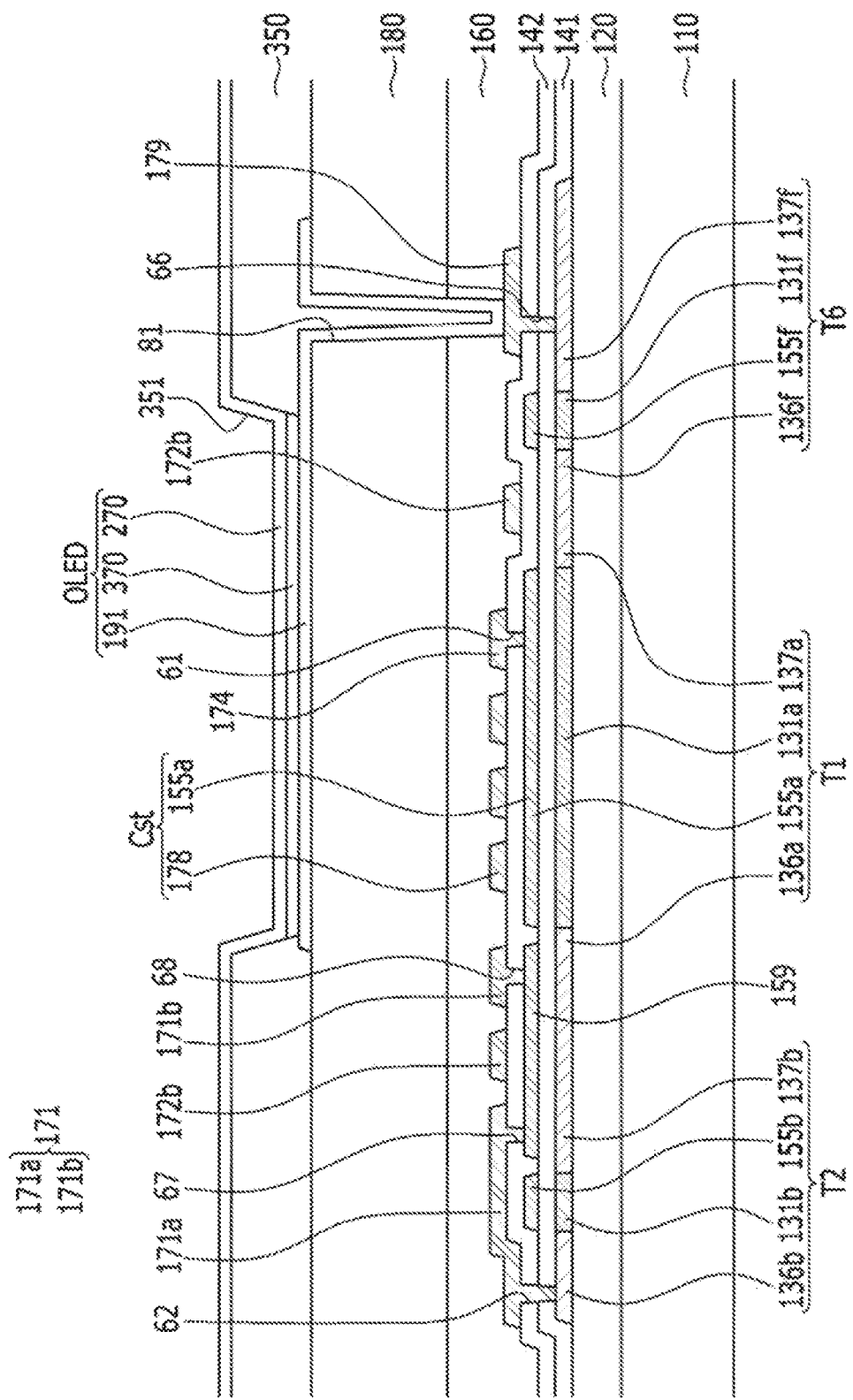
FIG. 5 is a cross-sectional view of the OLED display of FIG. 4 taken along a line V-V.
Figure 6:
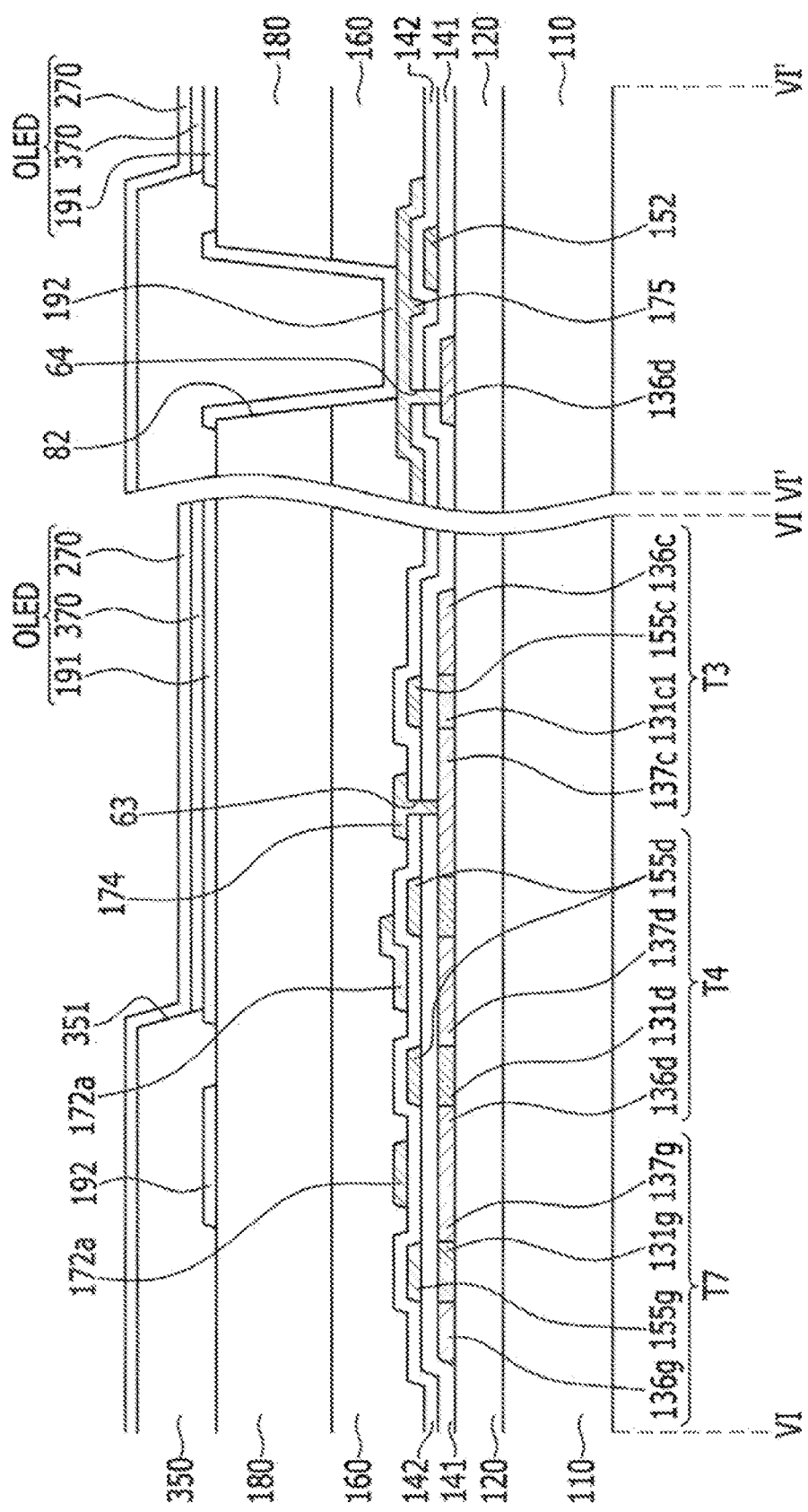
FIG. 6 is a cross-sectional view of the OLED display of FIG. 4 taken along lines VI-VI and VI'-VI'.

FIG. 3 is a schematic view of a plurality of transistor and a capacitor of an OLED display according to an exemplary embodiment. FIG. 4 is a detailed layout view of FIG. 3. FIG. 5 is a cross-sectional view of the OLED display of FIG. 4 taken along a line V-V. FIG. 6 is a cross-sectional view of the OLED display of FIG. 4 taken along lines VI-VI and VI'-VI'.

Hereinafter, a detailed planar structure of the OLED display according to the exemplary embodiment will be first described in detail with reference to FIG. 3 and FIG. 4, and a detailed cross-sectional structure will be described in detail with reference to FIG. 5 and FIG. 6.

Firstly, as shown in FIG. 3, the OLED display includes a scan line 151, a previous scan line 152, a light emission control line 153, and a bypass control line 158 respectively applying a scan signal Sn, a previous scan signal S(n−1), a light emission control signal EM, and a bypass signal BP. The lines 151, 152, 153, and 158 are formed in the row direction. The OLED display also includes a data line 171 and a driving voltage line 172 crossing the scan line 151, the previous scan line 152, the light emission control line 153, and the bypass control line 158. The driving voltage line 172 also applies a data signal Dm and a driving voltage ELVDD to the pixel. The initialization voltage Vint is transmitted to the compensation transistor T3 through the initialization voltage line 192. The driving voltage line 172 includes a first driving voltage line 172a substantially parallel to the data line 171 and a second driving voltage line 172b substantially parallel to the scan line 151. The first driving voltage line 172a and the second driving voltage line 172b are electrically connected to each other.

Also, the pixel 1 includes the driving transistor T1, the switching transistor T2, the compensation transistor T3, the initialization transistor T4, the operation control transistor T5, the first emission control transistor T6, the second emission control transistor T7, the storage capacitor Cst, and the OLED. The OLED includes a pixel electrode 191, an organic emission layer 370, and a common electrode 270. In this case, the compensation transistor T3 and the initialization transistor T4 are formed as dual gate transistors to prevent a leakage current.

Each channel of the transistors T1-T7 is formed in one semiconductor or semiconductor layer 130 connected thereto, and the semiconductor 130 can be curved with various shapes. The semiconductor 130 can be formed of a polycrystalline semiconductor material or an oxide semiconductor material. The oxide semiconductor can include one of oxides based on titanium (Ti), hafnium (Hf), zirconium (Zr), aluminum (Al), tantalum (Ta), germanium (Ge), zinc (Zn), gallium (Ga), tin (Sn), or indium (In), zinc oxide (ZnO), indium-gallium-zinc oxide (InGaZnO4), indium zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—

Ge—Sn—O), indium-germanium gallium oxide (In—Ge—Ga—O), titanium-indium-zinc oxide (Ti—In—Zn—O), and hafnium-indium-zinc oxide (Hf—In—Zn—O), which are complex oxides thereof. In the case when the semiconductor layer 130 is formed of the oxide semiconductor, in order to protect the oxide semiconductor that is vulnerable to an external environment such as a high temperature, a separate passivation layer can be added.

The semiconductor layer 130 can include a channel region in which a channel is doped with an N-type impurity or a P-type impurity, and a source region and a drain region which are formed at respective sides of the channel region. The source and drain regions are formed by doping an impurity which is opposite in polarity to the impurity doped in the channel region. In the present exemplary embodiment, the source doping region and the drain doping region respectively correspond to the source electrode and the drain electrode. The source electrode and the drain electrode can be formed by only doping the corresponding regions. Also, in the semiconductor 130, the region between the source electrodes and the drain electrodes of the different transistors are also doped such that the source electrode and the drain electrode are electrically connected to each other.

As shown in FIG. 4, a channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the first emission control transistor T6, and a bypass channel 131g formed in the second emission control transistor T7.

The driving transistor T1 includes the driving channel 131a, a driving gate electrode 155a, a driving source electrode 136a, and a driving drain electrode 137a. The driving channel 131a is curved and can have a meandering shape or a zigzag shape. As such, the curved driving channel 131a is formed, and thus the driving channel 131a can be elongated in a narrow space. Accordingly, since the driving channel 131a can be elongated, a driving range of the gate voltage applied to the driving gate electrode 155a is increased. Accordingly, since the driving range of a gate voltage is increased, an intensity of light emitted from the OLED can be more finely controlled by changing a magnitude of the gate voltage, thereby enhancing resolution of the OLED display and improving display quality. The shape of such a driving channel 131a is variously modified, and thus various exemplary embodiments such as 'reverse S', 'S', 'M', 'W', and the like are possible.

The driving gate electrode 155a overlaps the driving channel 131a, and the driving source electrode 136a and the driving drain electrode 137a are formed to be adjacent to respective sides of the driving channel 131a. The driving gale electrode 155a is connected to a first data connecting member 174 through a contact hole 61.

The switching transistor T2 includes the switching channel 131b, a switching gate electrode 155b, a switching source electrode 136b, and a switching drain electrode 137b. The switching gate electrode 155b is a part extending downwardly from the scan line 151 and overlaps the switching channel 131b, and the switching source electrode 136b and the switching drain electrode 137b are formed to be adjacent to respective sides of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c flat is a part of the scan line 151 is formed to prevent a leakage current and overlaps the compensation channel 131c. The compensation source electrode 136c and the compensation drain electrode 137c are Conned to be adjacent to respective sides of the compensation channel 131c. The compensation drain electrode 137c is connected to a first data connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is formed as two to prevent the leakage current and overlaps the initialization channel 131d. The initialization source electrode 136d and the initialization drain electrode 137d are formed to be adjacent to respective sides of the initialization channel 131d. The initialization source electrode 136d is connected to a second data connecting member 175 through a contact hole 64.

The operation control transistor T5 includes the operation control channel 131e, an operation control gale electrode 155e, an operation control source electrode 136e, and an operation control drain electrode 137e. The operation control gate electrode 155e that is a part of the light emission control line 153 overlaps the operation control channel 131e. The operation control source electrode 136e and the operation control drain electrode 137e are formed to be adjacent to respective sides of the operation control channel 131c. The operation control source electrode 136e is connected to a part that extends from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f. The light emission control source electrode 136f and the light emission control drain electrode 137f are formed to be adjacent to respective sides of the light emission control channel 131f. The light emission control drain electrode 137f is connected to the third data connecting member 179 through a contact hole 66.

The bypass transistor T7 includes the bypass channel 131g, a bypass gate electrode 155g, a bypass source electrode 136g, and a bypass drain electrode 137g. The bypass gate electrode 155g that is a part of the bypass control line 158 overlaps the bypass channel 131g, and the bypass source electrode 136g and the bypass drain electrode 137g are formed to be adjacent to respective sides of the bypass channel 131g.

The bypass source electrode 136g is connected directly to the light emission control drain electrode 137f, and the bypass drain electrode 137g is connected directly to the initialization source electrode 136d.

One end of the driving channel 131a is connected to the switching drain electrode 137b and the operation control drain electrode 137e The other end of the driving channel 131a is connected to the compensation source electrode 136c and the light emission control source electrode 136f.

The storage capacitor Cst includes a first storage electrode 155a and a second storage electrode 178 formed via a second gate insulating layer 142 interposed therebetween.

The first storage electrode 155a corresponds to the driving gate electrode 155a. The second storage electrode 178 is an expansion region of the first driving voltage line 172a and is formed one by one for each pixel. Here, the gate insulating layer 142 acts as the dielectric of the storage capacitor Cst, and a storage capacitance is determined by a charge charged to the storage capacitor Cst and a voltage between the electrodes 155a and 178. As described above, by using the driving gate electrode 155a as the first storage electrode 155a, a space for forming the storage capacitor can be obtained in the space that is decreased by the driving channel 131a occupied with the large area in the pixel.

The first storage electrode 155a is connected to the first data connecting member 174 through the contact hole 61 formed in the second gate insulating layer 142. The first data connecting member 174 is formed to be parallel to and on the same layer as the data line 171. The driving gate electrode 155a and the compensation drain electrode 137c are connected to each other.

Accordingly, the storage capacitor Cst stores a storage capacitance corresponding to the difference between the driving voltage ELVDD transferred to the second storage electrode 178 through the driving voltage line 172a and the gate voltage of the driving gate electrode 155a.

In this case, the second driving voltage line 172b connects the first driving voltage lines 172a formed in the pixels adjacent to each other. The second driving voltage line 172b and the data line 171 are formed on the same layer, thereby overlapping each other. Accordingly, to prevent the short of the second driving voltage line 172b and the data line 171, the data line 171 is divided into an upper data line 171a and a lower data line 171b in the portion crossing the second driving voltage line 172b. One end of the upper data line 171a is connected to a gate connecting member 159 through a contact hole 67, and one end of the lower data line 171b facing the upper data line 171a is connected to the gate connecting member 159 through a contact hole 68. The gate connecting member 159 is formed of the same material and on the same layer as the scan line 121.

A third data connecting member 179 is connected to the pixel electrode 191 through a contact hole 81, and the second data connecting member 175 is connected to the initialization voltage line 192 through a contact hole 82.

Hereinafter, a structure of the OLED display according to exemplary embodiments will be described in detail with reference to FIG. 5 and FIG. 6.

In this case, since the operation control TFT T5 is almost the same as a laminating structure of the emission control TFT T6, a detailed description is omitted.

A buffer layer 120 is formed on a substrate 110. The substrate 110 can be formed of an insulating substrate such as glass, quartz, ceramic, and plastic, and the buffer layer 120 blocks an impurity from the substrate 110 in a crystallization process to form a polycrystalline semiconductor, thereby improving a characteristic of the polycrystalline semiconductor and reducing a stress applied to the substrate 110.

The semiconductor 130 including the driving channel 131a, the switching channel 131b, the compensation channel 131c, the initialization channel 131d, the operation control channel 131e, the light emission control channel 131f, and the bypass channel 131g is formed on the buffer layer 120. Among the semiconductor 130, the driving source electrode 136a and the driving drain electrode 137a are formed at respective sides of the driving channel 131a, the switching source electrode 136b and the switching drain electrode 137b are formed at respective sides of the switching channel 131b, and the compensation source electrode 136c and the compensation drain electrode 137c are formed at respective sides of the compensation channel 131c. Also, the initialization source electrode 136d and the initialization drain electrode 137d are formed at respective sides of the initialization channel 131d, the operation control source electrode 136e and the operation control drain electrode 137e are formed at respective sides of the operation control channel 131e, the light emission control source electrode 136f and the light emission control drain electrode 137f are formed at respective sides of the light emission control channel 131f, and the bypass source electrode 136g and the bypass drain electrode 137g are formed at respective sides of the bypass channel 131g.

A first gate insulating layer 141 covering the semiconductor 130 is formed thereon. On the first gate insulating layer 141, gate wires 151, 152, 153, 155a, 155b, 155c, 155d, 155e, 155f, 158, and 159 including the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the driving gate electrode (the first storage electrode) 155a, the bypass control line 158, and the gate connecting member 159 are formed.

The second gate insulating layer 142 is formed on the gate wires 151, 152, 153, 155a, 155b, 155c, 155d, 155e, 155f, 158, and 159 and the first gate insulating layer 141. The first gate insulating layer 141 and the second gate insulating layer 142 are formed of a silicon nitride (SiNx) or a silicon oxide (SiOx).

On the second gate insulating layer 142, data wires 171, 172a, 172b, 174, 175, 178, and 179 including the data line 171, the first driving voltage line 172a including the second storage electrode 178 and the second driving voltage line 172b, the first data connecting member 174, the second data connecting member 175, and the third data connecting member 179 are formed.

The data wires 171, 172a, 172b, 174, 175, 178, and 179 can be formed of a triple layer of titanium/aluminum/titanium (Ti/Al/Ti), and since aluminum is a low resistance metal, a voltage drop is prevented.

As described above, the second storage electrode 178 is formed of the same material and on the same layer as the second driving voltage line 172b and the data line 171 without the formation of the second storage capacitive plate as a separate layer such that a number of masks used in manufacturing can be reduced. Also, the second storage electrode 178, the second driving voltage line 172b, and the data line 171 are formed on the same layer such that an insulating layer to insulate the second storage electrode 178 from the second driving voltage line 172b and the data line 171 is not necessary and the short between the second storage electrode 178 and the second driving voltage line 172b and the data line 171 can be prevented.

The data line 171 is connected to the switching source electrode 136b through the contact hole 62 formed in the first and second gate insulating layers 141 and 142. The second data connecting member 175 is connected to the initialization drain electrode 137d through the contact hole 64 formed in the first and second gate insulating layers 141 and 142. The third data connecting member 179 is connected to the light emission control drain electrode 137f through the contact hole 66 formed in the first and second gate insulating layers 141 and 142. Also, one end of the upper data line 171a is connected to one end of the gate connecting member 159 through the contact hole 67 formed in the first and second gate insulating layers 141 and 142, and one end of the lower data line 171b separated from the upper data line 171a is connected to the other end of the gate connecting member 155 through the contact hole 68.

An interlayer insulating layer 160 covering the data wires 171, 172a, 172b, 174, 175, 178, and 179 and the second gate insulating layer 142 is formed thereon. The interlayer insulating layer 160 is formed of a silicon nitride (SiNx) or a silicon oxide (SiOx). As described above, the data wire is covered by the interlayer insulating layer 160 such that the data wire can be protected from external moisture. A passivation layer 180 covering the interlayer insulating layer 160 is formed thereon. The passivation layer 180 can be formed of an organic layer. A pixel electrode 191 and an initialization voltage line 192 are formed on the passivation layer 180. The third data connecting member 179 is connected to the pixel electrode 191 through the contact hole 81 formed in the passivation layer 180, end the second data connecting member 175 is connected to the initialization voltage line 192 through the contact hole 82 of the passivation layer 180.

As described above, the data line 171 is divided into the upper data line 171a and the lower data line 171b in the crossing portion where the data line 171 and the second driving voltage line 172b cross. The divided upper data line 171a and lower data line 171b are connected through the gate connecting member 159 such that the data line 171 and the second driving voltage line 172b can be formed on the same layer without the generation of the short-circuit therebetween. Accordingly, the driving voltage line 172 can be formed of a mesh structure in which the first driving voltage line 172a of the vertical direction and the second driving voltage line 172b of the horizontal direction are connected to each other, thereby preventing the voltage drop of the driving voltage ELVDD.

A pixel definition layer 350 covering the passivation layer 180, the initialization voltage line 192, and the edge of the pixel electrode 191 is formed thereon. The pixel definition layer 350 has a pixel opening 351 exposing the pixel electrode 191. The pixel defining layer 190 can be formed of a polyacrylate resin, a polyimide resin, or a silica-based inorganic material.

The organic emission layer 370 is formed on the pixel electrode 191 exposed by the pixel opening 351, and the common electrode 270 is formed on the organic emission layer 370. As described above, the OLED including the pixel electrode 191, the organic emission layer 370, and the common electrode 270 is formed.

Herein, the pixel electrode 191 is an anode which is a hole injection electrode, and the common electrode 270 is a cathode which is an election injection electrode. However, the exemplary embodiments are not limited thereto, and the pixel electrode 191 can be the cathode and the common electrode 270 can be the anode according to a driving method of the OLED display. When holes and electrons are injected into the organic emission layer 370 from the pixel electrode 191 and the common electrode 270, respectively, and excitons acquired by combining the injected holes and elections fall from an excitation state to a ground state, light is emitted.

The organic emission layer 370 is formed of a low-molecular organic material or a high-molecular organic material such as poly(3,4-ethylenedioxythiophene) (PEDOT). Further, the organic emission layer 370 can be formed of multiple layers including at least one of an emission layer, a hole injection layer (HIL), a hole transporting layer (HTL), an electron transporting layer (ETL), and an electron injection layer (EXL). When the organic emission layer 370 includes all of the layers, the hole injection layer is formed on the pixel electrode 191 which is the positive electrode, and the hole transporting layer, the emission layer, the electron transporting layer, and the electron injection layer are sequentially laminated thereon.

The organic emission layer 370 can include a red organic emission layer emitting red light, a green organic emission layer emitting green light, and a blue organic emission layer emitting blue light. The red, green, and blue organic emission layers are formed at a red pixel, a green pixel, and a blue pixel, respectively, to implement color images.

Further, in the organic emission layer 370, all of the red, green, and blue organic emission layers are laminated together on the ted pixel, the green pixel, and the blue pixel. A red color filter, a green color filter, and a blue color filter are formed for each pixel to implement the color images. As another example, a white organic emission layer emitting white light is formed on all of the red, green, and blue pixels, and the red, green, and blue color filters are formed for each pixel to implement the color images. In some embodiments, when the color images are implemented by using the white organic emission layer and the color filters, a deposition mask for depositing the red, green, and blue organic omission layers on individual pixels, that is, the red pixel, the green pixel, and the blue pixel, respectively, are not used.

The white organic emission layer described in another example can be formed by one organic emission layer, and even includes a configuration that can emit white light by laminating a plurality of organic emission layers. As an example, the white organic emission layer can include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the OLED can be formed on the common electrode 270. And the encapsulation member can be sealed by a sealant and can be formed of various materials such as glass, quartz, ceramic, plastic, and a metal. On the other hand, a thin film encapsulation layer can be formed on the common electrode 270 by depositing the inorganic layer and the organic layer with the usage of the sealant.

A manufacturing method of the OLED display according to an exemplary embodiment will now be described with reference to accompanying drawings.

Figure 7:
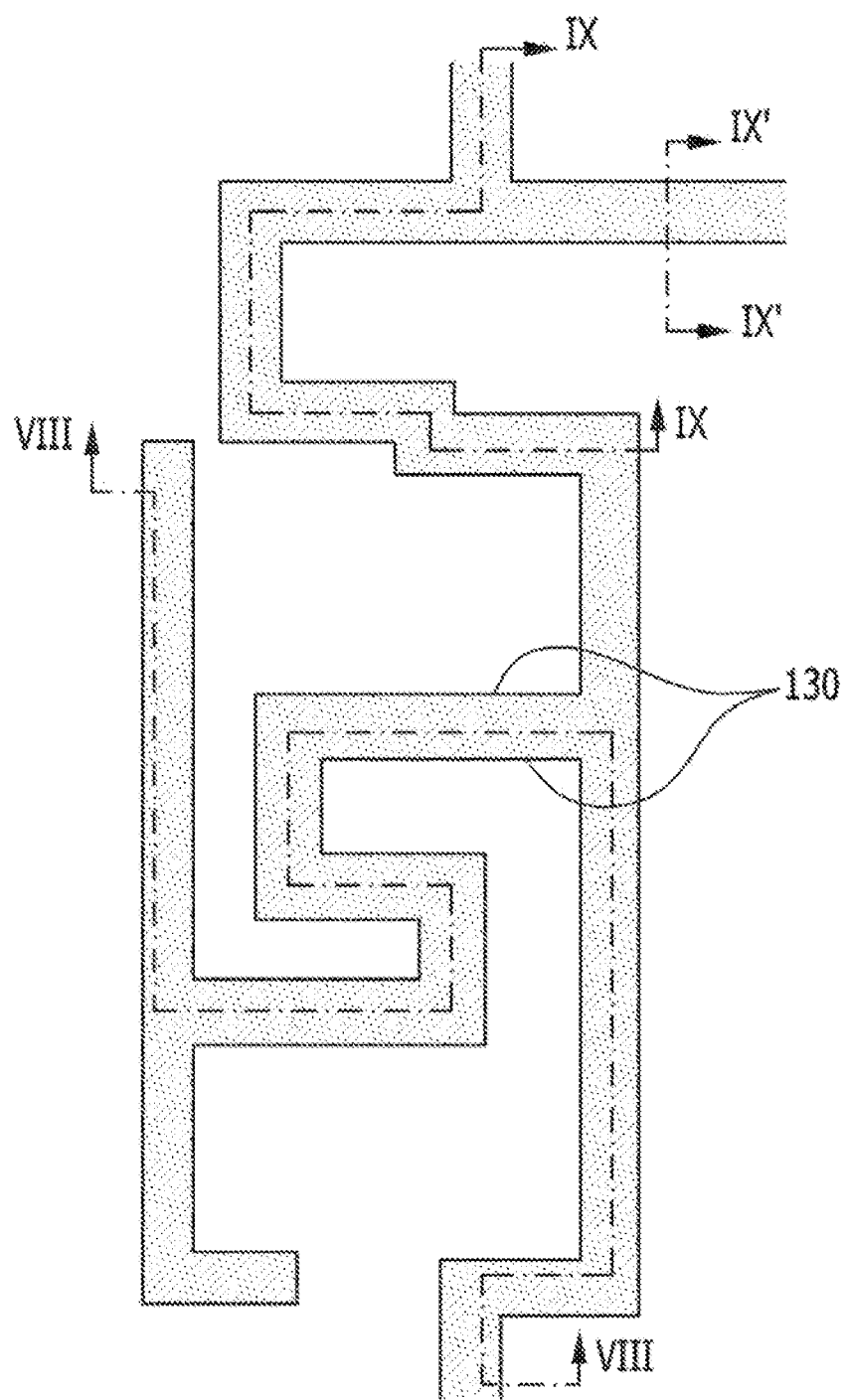
FIG. 7, FIG. 10, and FIG. 13 are layout views sequentially showing a manufacturing method of an OLED display according to exemplary embodiments.
Figure 8:
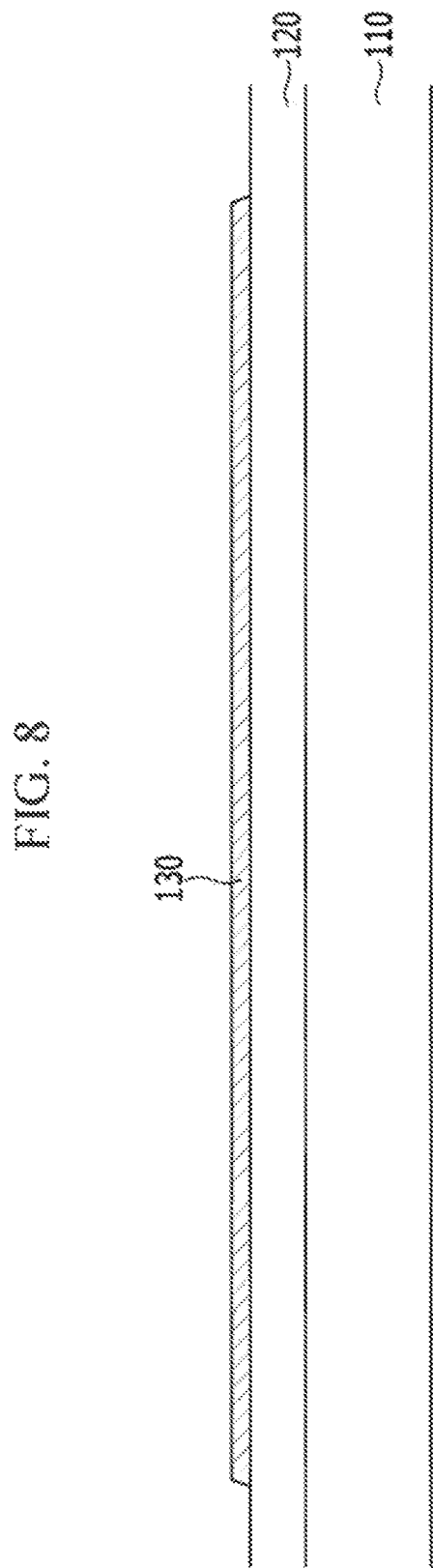
FIG. 8 is a cross-sectional view of the OLED display of FIG. 7 taken along a line VIII-VIII.
Figure 9:
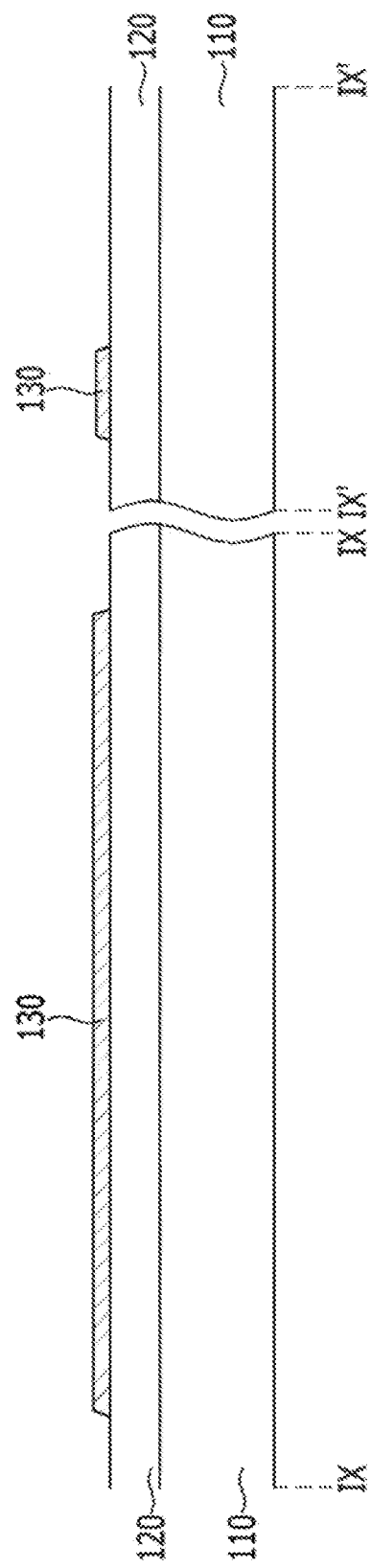
FIG. 9 is a cross-sectional view of the OLED display of FIG. 7 taken along lines IX-IX and IX'-IX'.
Figure 10:
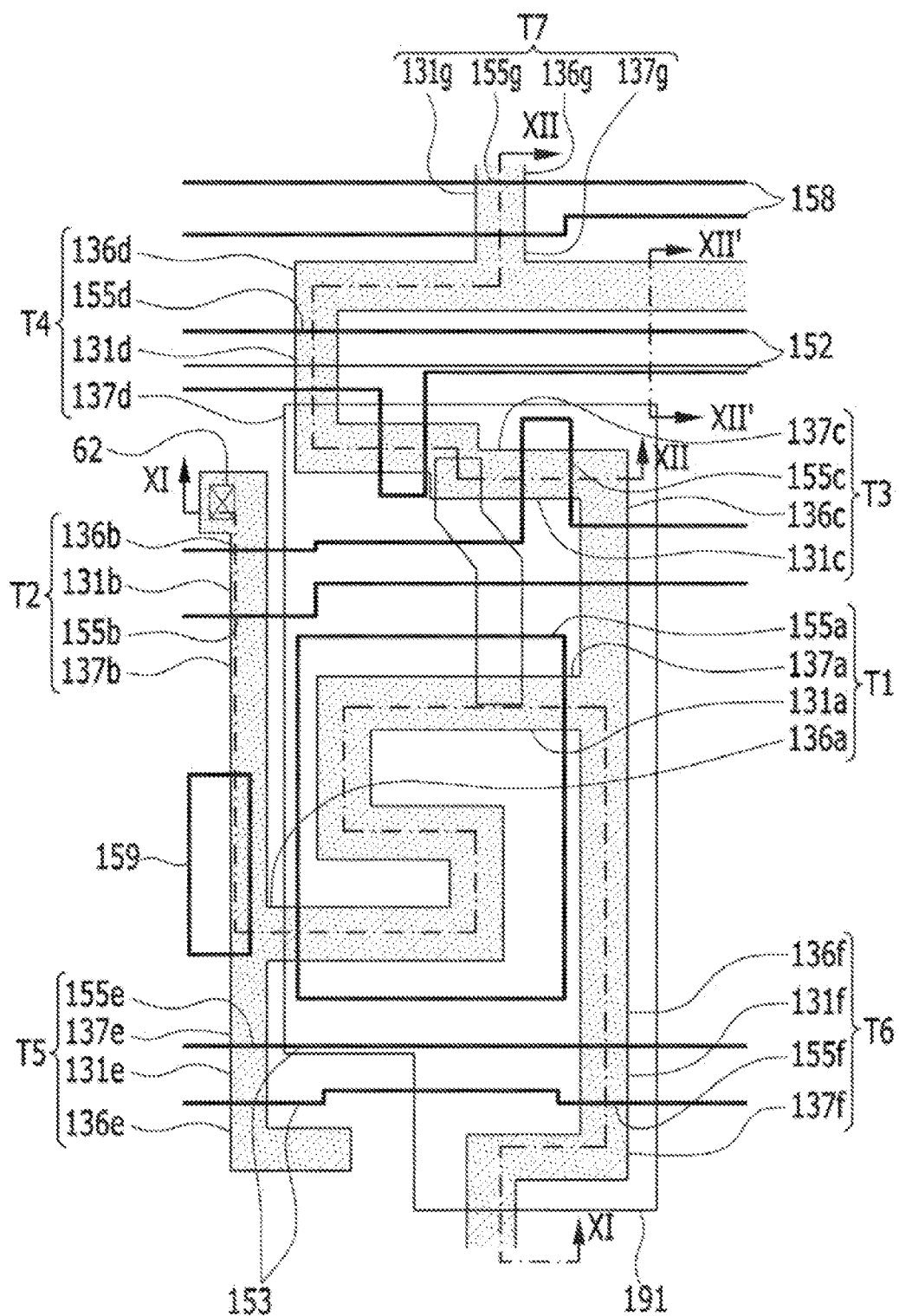
Figure 11:
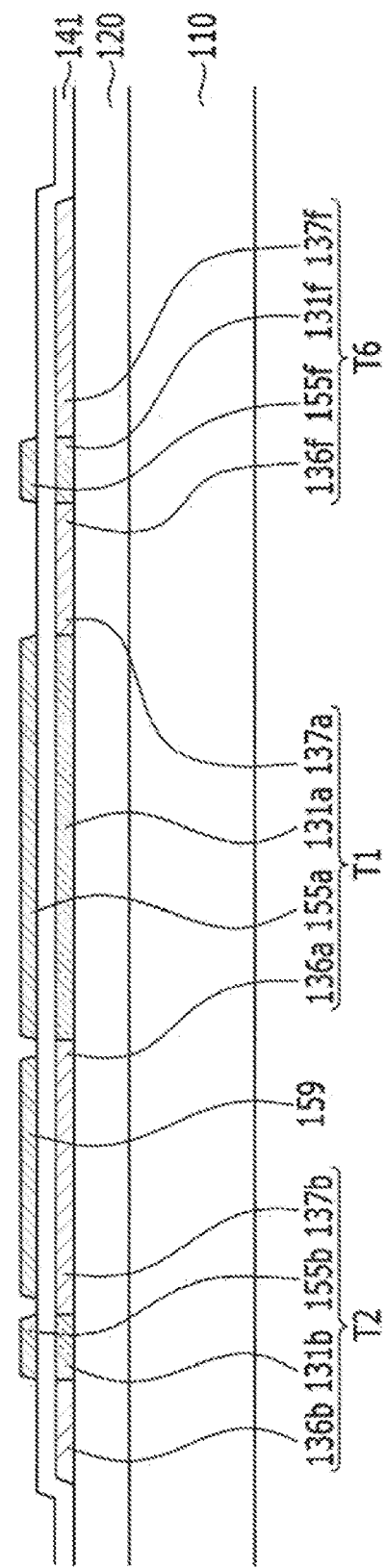
FIG. 11 is a cross-sectional view of the OLED display of FIG. 10 taken along a line XI-XI.
Figure 12:
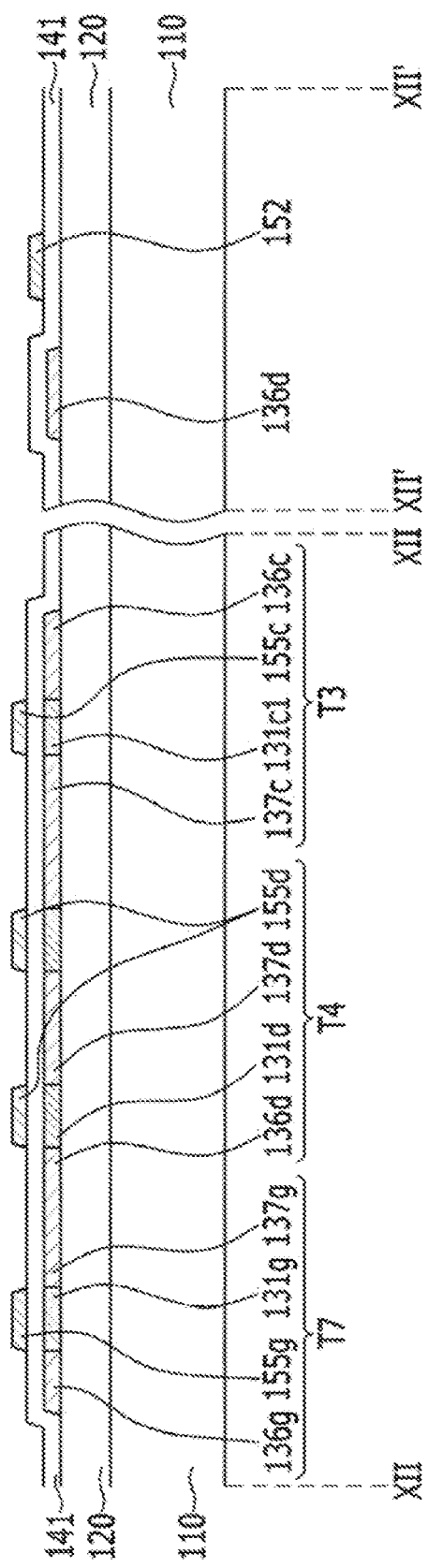
FIG. 12 is a cross-sectional view of the OLED display of FIG. 10 taken along lines XII-XII and XII'-XII'.
Figure 13:
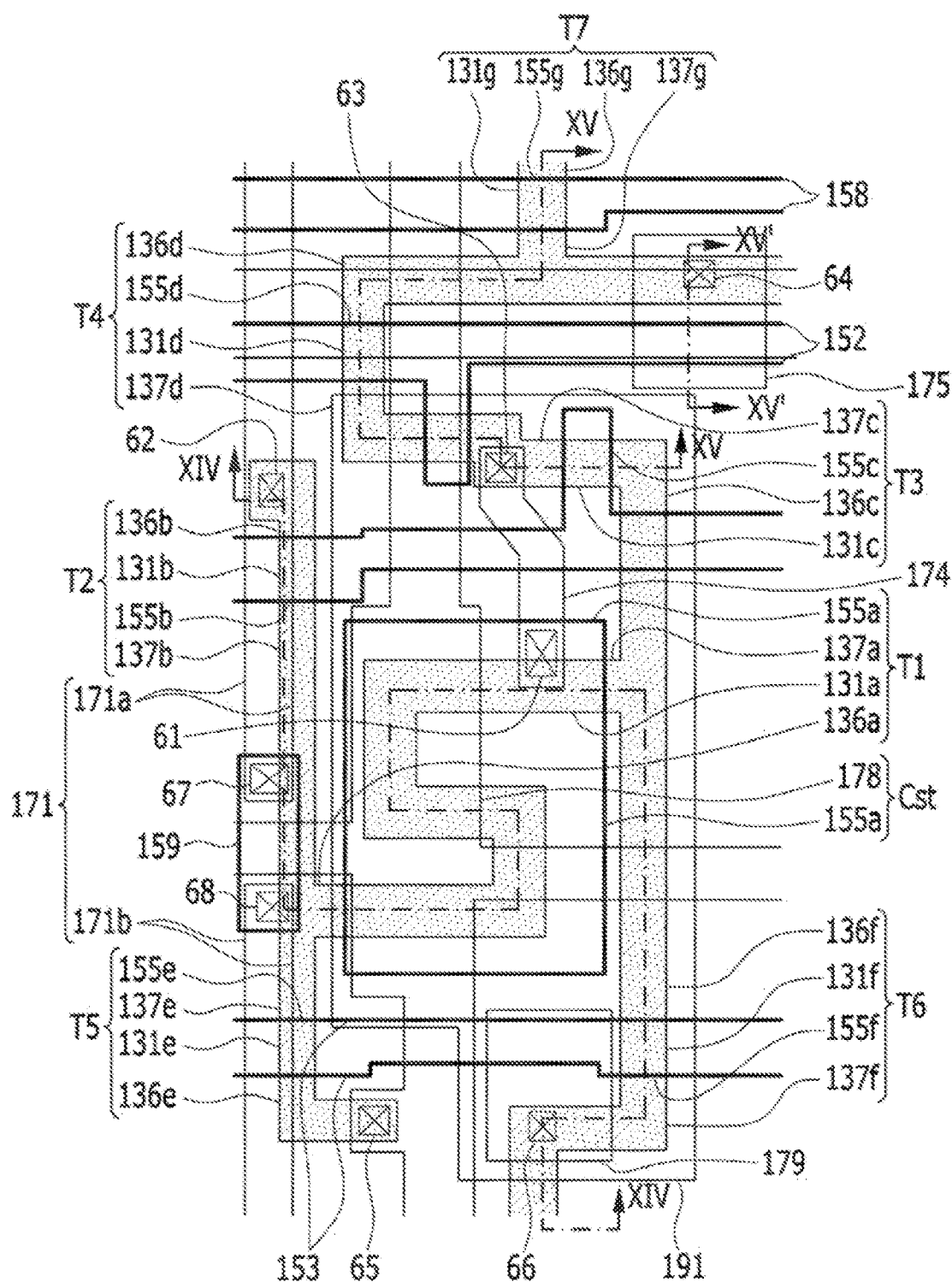
Figure 14:
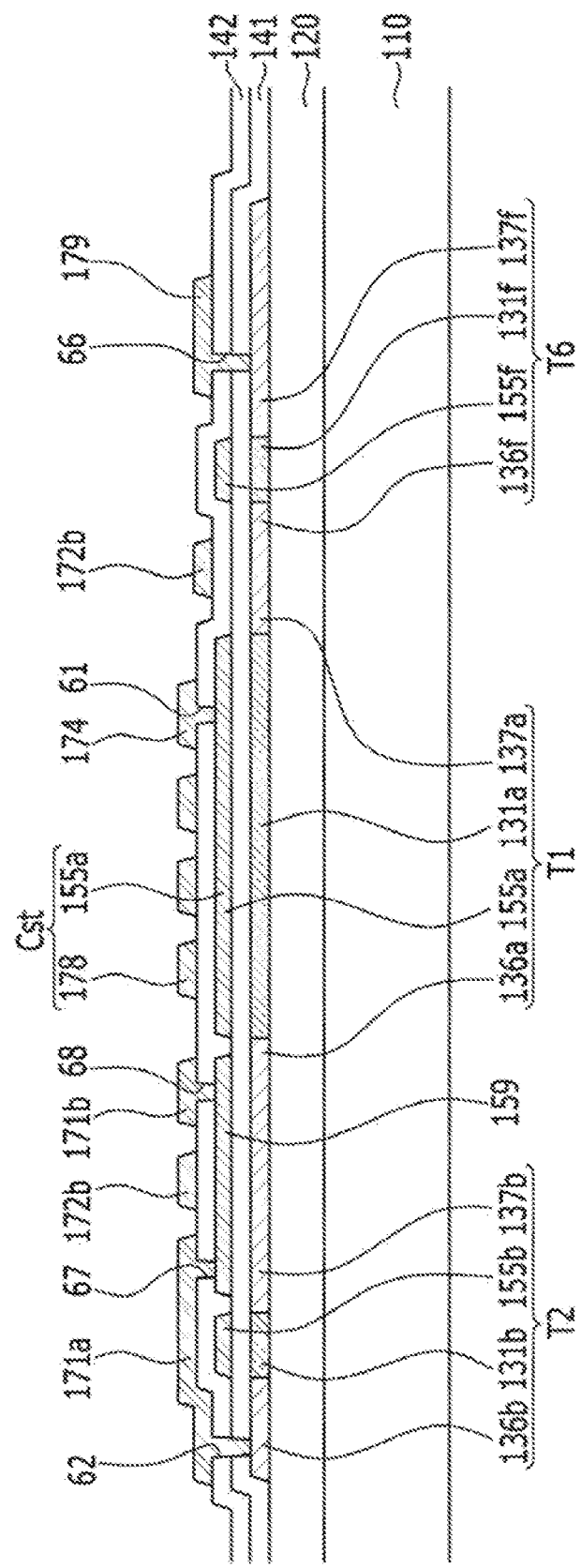
FIG. 14 is a cross-sectional view of the OLED display of FIG. 13 taken along a line XIV-XIV.
Figure 15:
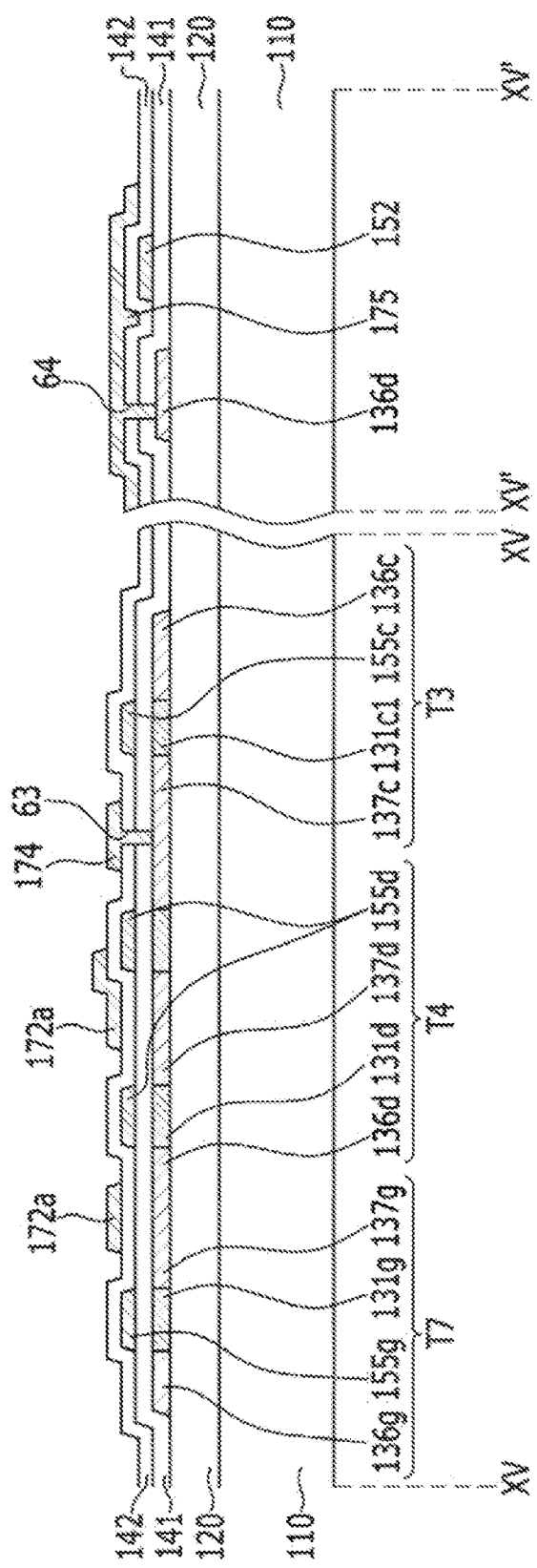
FIG. 15 is a cross-sectional view of the OLED display of FIG. 13 taken along lines XV-XV and XV'-XV'.

FIG. 7, FIG. 10, and FIG. 13 are layout views sequentially showing a manufacturing method of an OLED display according to an exemplary embodiment. FIG. 8 is a cross-sectional view of the OLED display of FIG. 7 taken along a line VIII-VIII. FIG. 9 is a cross-sectional view of the OLED display of FIG. 7 taken along line; IX-IX and IX'-IX'. FIG. 11 is a cross-sectional view of the OLED display of FIG. 10 taken along a line XI-XI. FIG. 12 is a cross-sectional view of the OLED display of FIG. 10 taken along lines XII-XII and XII'-XII'. FIG. 14 is a cross-sectional view of the OLED display of FIG. 13 taken along a line XIV-XIV. FIG. 15 is a cross-sectional view of the OLED display of FIG. 13 taken along lines XV-XV and XV'-XV'.

First, as illustrated in FIG. 7 to FIG. 9, the buffer layer 120 is formed on the substrate 110. The buffer layer 120 can be formed of a single layer of a silicon nitride or a laminate layer of a silicon nitride and a silicon oxide, and is deposited on an entire surface of the substrate 110 by a method such as plasma enhanced chemical vapor deposition (PECVD). In addition, the semiconductor layer is formed on the buffer layer 120. The semiconductor layer can be formed of polysilicon or an oxide semiconductor, and the polysilicon can be formed by a method of forming an amorphous silicon layer and then crystallizing the layer. Various known methods can be applied as the crystallizing method, and for example, the amorphous silicon layer can be crystallized by using heat, a laser, Joule heat, an electric field, a catalyst metal, or the like. The semiconductor layer is an intrinsic semiconductor that is not doped with the impurity. In addition, on the polycrystalline semiconductor layer, a photolithography process is performed by using a first mask, and the polycrystalline semiconductor layer is patterned as the semiconductor 130 having the shape illustrated in FIG. 7. The semiconductor 130 is not doped, and as a result, the semiconductor 131 is not divided into the semiconductor, the source electrode, and the drain electrode configuring each transistor. Also, the channel doping having a low doping concentration is performed to the semiconductor 130 to make the semiconductor 130 into an impurity semiconductor.

Next, as shown in FIG. 10 to FIG. 12, the first gate insulating layer 141 covering the buffer layer 120 and the semiconductor 130 is formed thereon. The first gate insulating layer 141 is formed by entirely depositing a silicon nitride (SiNx) or a silicon oxide (SiOx) by a method such as plasma enhanced chemical vapor deposition (PECVD). Further, a gate metal layer is deposited on the first gate insulating layer 141. The gate metal layer is patterned through a photolithography process by using a second mask. As a result, the gate wire including the scan line 151, the previous scan line 152, the light emission control line 153, the bypass control line 158, the driving gate electrode 155a, and the gate connecting member 159 is formed. The gate metal layer can be formed as a multilayer in which a metal layer formed of any one of copper (Cu), a copper alloy, aluminum (Al), and an aluminum alloy and a metal layer including any one of molybdenum (Mo) and a molybdenum alloy are laminated.

Source and drain doping of a higher doping concentration than the channel doping is performed to the semiconductor 130. The semiconductor 130 is source/drain-doped to the exposed region except for the portion that is covered by the switching gate electrode 155b, the compensation gate electrode 155c, the initialization gate electrode 155d, the operation control gate electrode 155e, the light emission control gate electrode 155f, the bypass gate electrode 155g, and the driving gate electrode 155a. As a result, the source electrode and the drain electrode of each transistor are formed. The channel 131 of each transistor is formed in the region that is covered to not be doped in the semiconductor 130. That is, the driving channel 131a, the switching channel 131b, the compensation channel 131c, the initialization channel 131d, the operation control channel 131e, the light emission control channel 131f, and the bypass channel 131g are substantially simultaneously formed. As described above, a separate mask is nor required when source/drain-doping the semiconductor 130.

Next, as shown in FIG. 13 to FIG. 15, the second gate insulating layer 142 covering the first gate insulating layer 141, the scan line 151, the previous scan line 152, the light emission control line 153, the bypass control line 158, and the driving gate electrode 155a is formed thereon. The first insulating layer 141 is formed by entirely depositing a silicon nitride (SiNx) or a silicon oxide (SiOx) by a method such as plasma enhanced chemical vapor deposition (PECVD). In addition, the impurity doped on the semiconductor 130 is positioned well by performing a dopant activation process, and the damage to an interface between the semiconductor 130 and the first insulating layer 141 is eliminated.

The first gate insulating layer 141 and the second gate insulating layer 142 are patterned by the photolithography process using a third mask to form a plurality of contact holes 61, 62, 63, 64, 65, 66, 67, and 68. A data metal layer is formed on the second gate insulating layer 142. The data metal layer can be formed as a multilayer in which a metal layer formed of any one of copper (Cu), a copper alloy, aluminum (Al), and an aluminum alloy and a metal layer formed of molybdenum (Mo) and a molybdenum alloy are laminated. For example, the data metal layer can be formed as a triple layer of titanium/aluminum titanium (Ti/Al/Ti), a triple layer of molybdenum/aluminum/molybdenum (Mo/Al/Mo), or a triple layer of molybdenum/copper/molybdenum (Mo/Cu/Mo).

In addition, the data metal layer is patterned by the photolithography process using a fourth mask. Accordingly, the data wires including the upper data line 171a, the lower data line 171b, the first driving voltage line 172a including the second storage electrode 178, the second driving voltage line 172b, the first data connecting member 174, the second data connecting member 175, and the third data connecting member 179 is formed on the second gate insulating layer 142. As described above, the second storage electrode 178 is formed of the same material and on the same layer as the second driving voltage line 172b and the data line 171 without the formation of the second storage capacitive plate as the separate layer, thereby reducing the number of masks used in the manufacturing. Also, by connecting the upper data line 171a and the lower data line 171b that are separated through the gate connecting member 159, the data line 171 and the second driving voltage line 172b can be formed with the same layer.

Next, as shown in FIG. 4 to FIG. 6, the interlayer insulating layer 160 covering the data wires 171, 172, 174, 175, 178, and 179 is formed on the second gate insulating layer 142. Also, a passivation layer 180 is formed on the interlayer insulating layer 160. The interlayer insulating layer 160 and the passivation layer 180 are patterned by the photolithography process using the fifth mask to form the contact holes 81 and 82. Further, a pixel electrode layer is formed on the passivation layer 180 and is patterned by the photolithography process using a sixth mask. Accordingly, the pixel electrode 191 connected to the third data connecting member 179 through the contact hole 81 and the initialization voltage line 192 connected to the second data connecting member 175 through the contact hole 82 are formed on the passivation layer 180. The pixel definition layer 350 covering the pixel electrode 191 and the initialization voltage line 192 is formed on the passivation layer 180 and is patterned to form the pixel opening 351 exposing the portion of the pixel electrode 191 by using a seventh mask. The organic emission layer 370 is formed on the pixel electrode 191 exposed through the pixel opening 351 of the pixel definition layer 350. The common electrode 270 is formed on the organic emission layer 370 to complete the OLED. The common electrode 270 is formed throughout the entire region on the pixel definition layer 350 such that the separate mask is not used. As described, the manufacturing method from the semiconductor 130 to the common electrode 270 using the total of seven masks is referred to as a 7 mask process, and the structure of the OLED display manufactured by the 7 mask process is referred to as a 7 mask structure.

On the other hand, in the present exemplary embodiment, the 7 mask structure in which the storage capacitor and the driving gate electrode overlap is described, however another exemplary embodiment of the 7 mask structure in which the storage capacitor and the driving gate electrode do not overlap is possible.

Next, another exemplary embodiment will be described with reference to FIG. 16 to FIG. 19.

Figure 16:
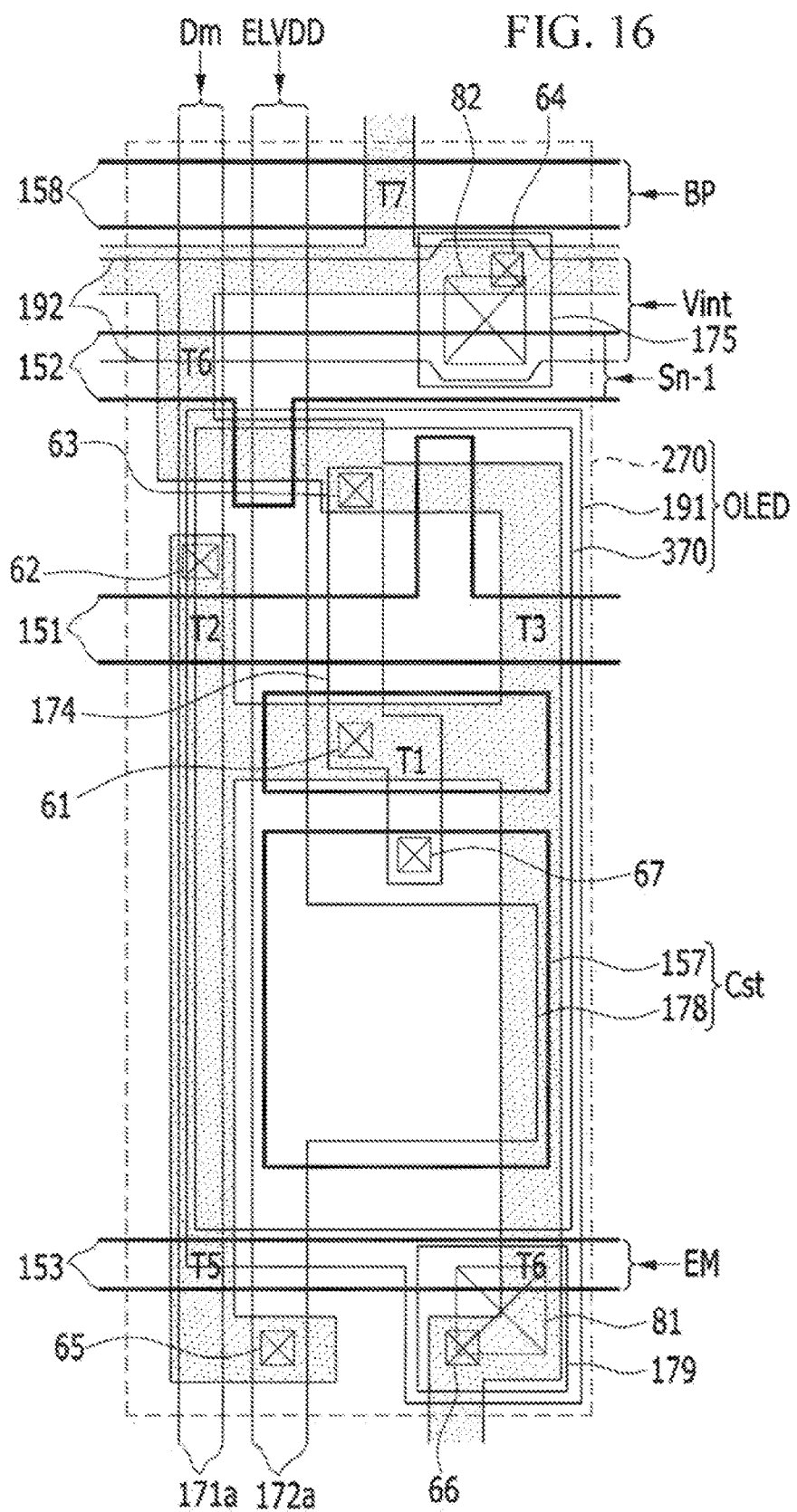
FIG. 16 is a schematic view of a plurality of transistors and a capacitor of an OLED display according to another exemplary embodiment.
Figure 17:
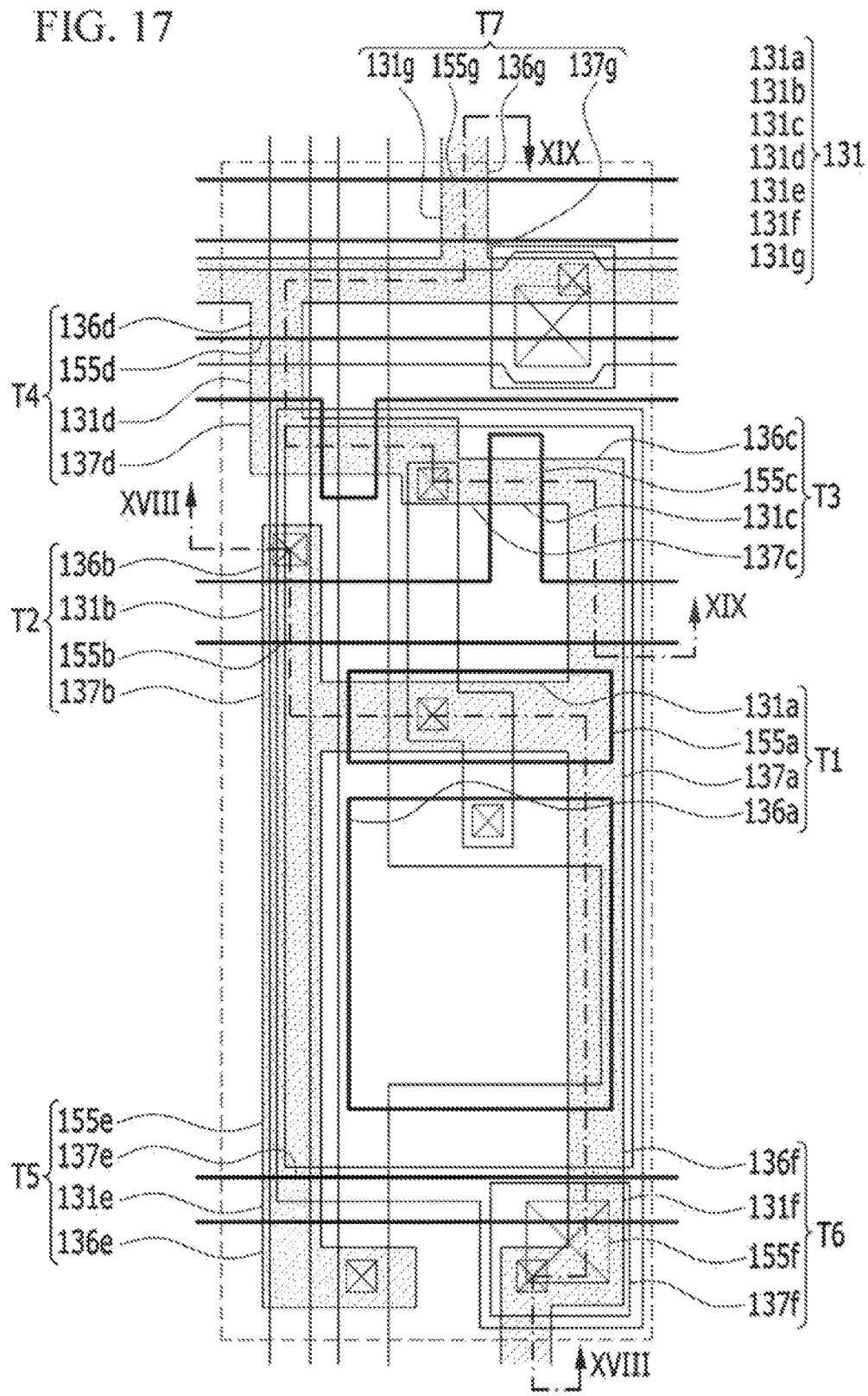
FIG. 17 is a detailed layout view of FIG. 16.
Figure 18:
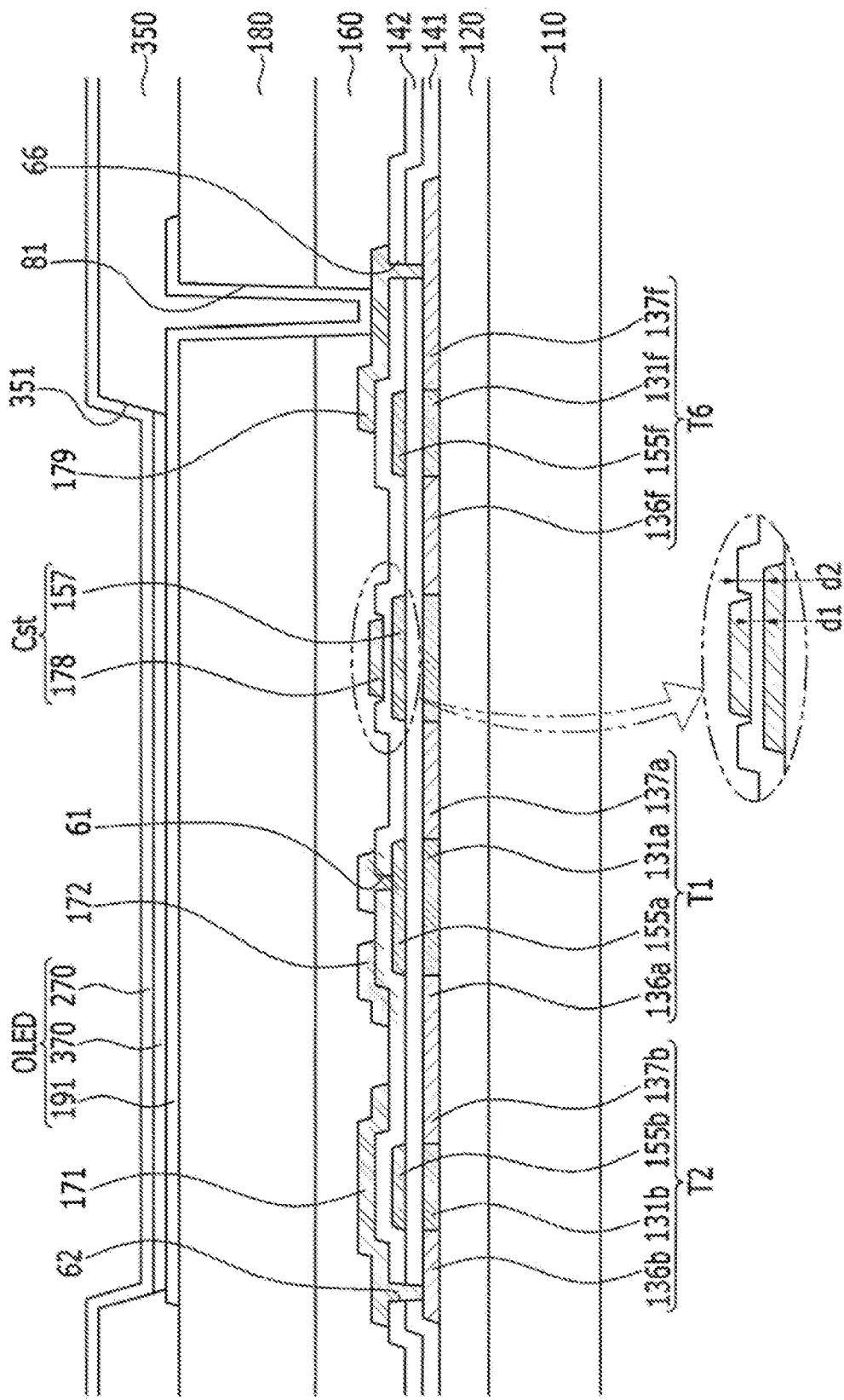
FIG. 18 is a cross-sectional view of the OLED display of FIG. 17 taken along a line XVIII-XVIII.
Figure 19:
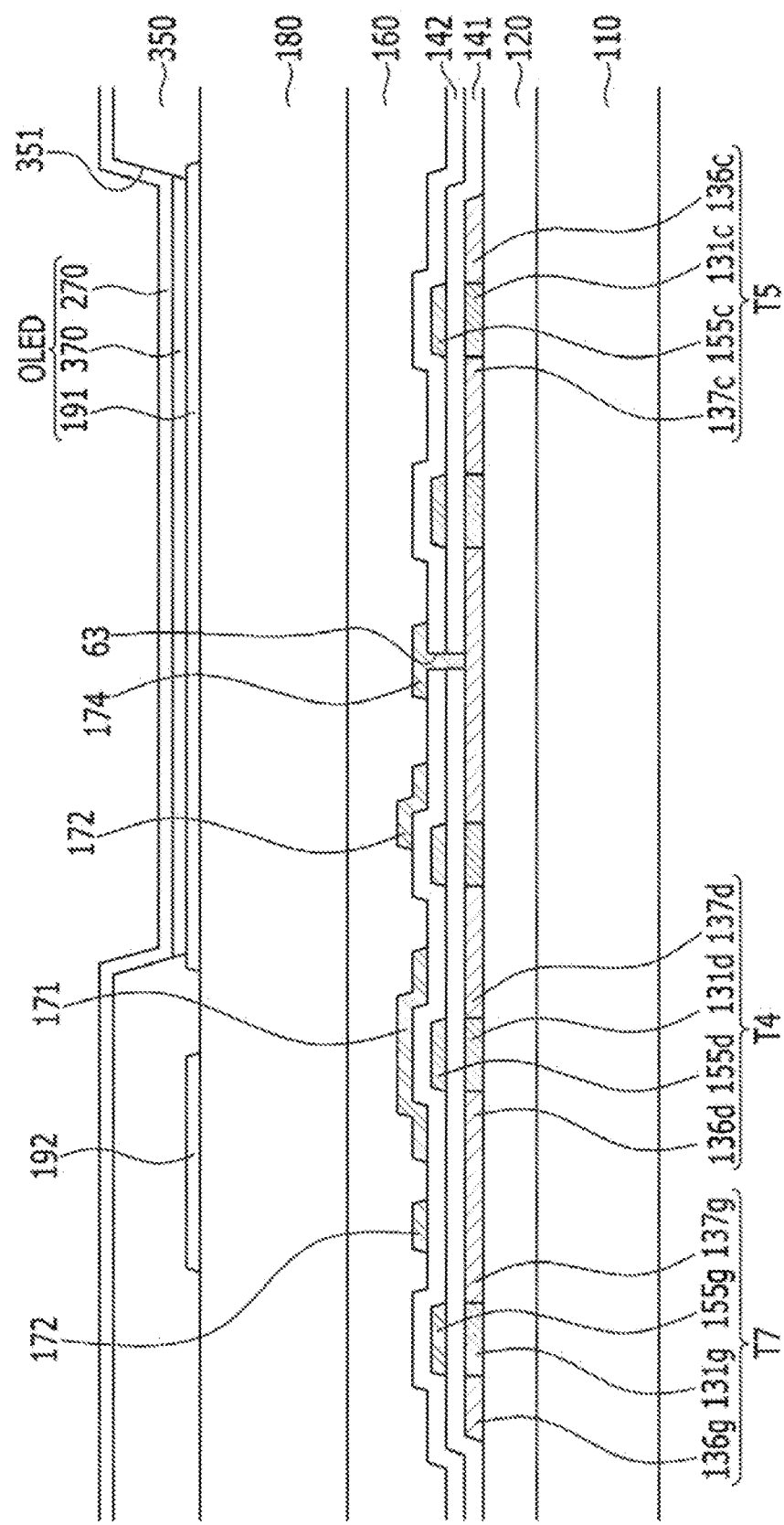
FIG. 19 is a cross-sectional view of the OLED display of FIG. 17 taken along a line XIX-XIX.

FIG. 16 is a schematic view of a plurality of transistor and a capacitor of an OLED display according to another exemplary embodiment. FIG. 17 is a detailed layout view of FIG. 16. FIG. 18 is a cross-sectional view of the OLED display of FIG. 17 taken along a line XVIII-XVIII. FIG. 19 is a cross-sectional view of the OLED display of FIG. 17 taken along a line XIX-XIX.

The exemplary embodiment shown in FIG. 16 to FIG. 19 is substantially the same as the exemplary embodiment shown in FIG. 1 to FIG. 6 except for that the storage capacitor and the driving gate electrode that overlap each other such that the repeated description is omitted.

As shown in FIG. 16 to FIG. 19, the OLED display according to the current exemplary embodiment includes the scan line 151, the previous scan line 152, the light emission control line 153, and the bypass control line 158, and the data line 171. The OLED display also includes the driving voltage line 172 crossing the scan line 151, the previous scan line 152, the light emission control line 153, and the bypass control line 158. Also, the driving transistor T1, the switching transistor T2, the compensation transistor T3, the initialization transistor T4, the operation control transistor T5, the light emission control transistor T6, the bypass transistor T7, the storage capacitor Cst, and the OLED (OLED) are formed in the pixel 1. The OLED includes the pixel electrode 191, the organic emission layer 370, and the common electrode 270.

The channel 131 includes a driving channel 131a formed in the driving transistor TL a switching channel 131b formed in the switching transistor T2, a compensation channel 131c formed in the compensation transistor T3, and an initialization channel 131d formed in the initialization transistor T4. The channel 131 also includes an operation control channel 131e formed in the operation control transistor T5, a light emission control channel 131f formed in the first emission control transistor T6, and a bypass channel 131g formed in the second emission control transistor T7.

The storage capacitor Cst includes a first storage electrode 157 and the second storage electrode 178 formed via the second gate insulating layer 142 interposed therebetween. The first storage electrode 157 is separated from the driving gate electrode 155a and is formed on the same layer. The second storage electrode 178 is the expansion region of the first driving voltage line 172a and is formed one by one for each pixel.

The first storage electrode 157 is connected to a lower portion of the first data connecting member 174 through the contact hole 67, and the first data connecting member 174 is connected to the driving gate electrode 155a through the contact hole 61. Accordingly, the first storage electrode 157 is electrically connected to the driving gate electrode 155a.

Accordingly, the storage capacitor Cst stores the storage capacitance corresponding to the difference between the driving voltage ELVDD transmitted to the second storage electrode 178 through the driving voltage line 172 and the gate voltage Vg of the driving gate electrode 155a.

The first data connecting member 174 is formed to be substantially parallel to the data line 171. An upper portion of the first data connecting member 174 is connected to the initialization drain electrode 137d through the contact hole 63, a center portion of the first data connecting member 174 is connected to the driving gate electrode 155a through the contact hole 61, and a lower portion of the first data connecting member 174 is connected to the first storage electrode 157 through the contact hole 67.

Next, a cross-sectional structure of the OLED display according to the second exemplary embodiment will be described with reference to FIG. 18 and FIG. 19.

The buffer layer 120 is formed on the substrate 110. The semiconductor 130 including the driving channel 131a, the switching channel 131b, the compensation channel 131c, the initialization channel 131d, the operation control channel 131e, the light emission control channel 131f, and the bypass channel 131g is formed on the buffer layer 120.

The first gate insulating layer 141 covering the semiconductor 130 is formed thereon. The scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the driving gate electrode (the first storage capacitive plate) 155a, and the bypass control line 158 are formed on the first gate insulating layer 141.

The second gate insulating layer 142 covering the gate wires 151, 152, 153, 155a, 155b, 155c, 155d, 155e, 155f, and 158 and the first gate insulating layer 141 is formed thereon. The data wires 171, 172, 174, 175, 178, and 179 including the data line 171, the driving voltage line 172 including the second storage electrode 178, the first data connecting member 174, the second data connecting member 175, and the third data connecting member 179 are formed on the second gate insulating layer 142.

The data line 171 is connected to the switching source electrode 136b through the contact hole 62 formed in the first gate insulating layer 141 and the second gate insulating layer 142. The first data connecting member 174 is respectively connected to the initialization drain electrode 137d, the driving gate electrode 155a, and the first storage electrode 157 through the contact holes 63, 61, and 67 formed in the first gate insulating layer 141 and the second gate insulating layer 142. Also, the second data connecting member 175 is connected to the initialization source electrode 136d and the bypass drain electrode 137s through the contact hole 64 formed in the first gate insulating layer 141 and the second gate insulating layer 142. The third data connecting member 179 is connected to the light emission control drain electrode 137f through the contact hole 66 formed in the first gate insulating layer 141 and the second gate insulating layer 142.

In this case, a thickness d1 of the second gate insulating layer 142 positioned between the first storage electrode 157 and the second storage electrode 178 forming the storage capacitor Cst is less than a thickness d2 of the second gate insulating layer 142 at other positions. By using a half-tone mask without a separate mask, the thickness d1 of the second gate insulating layer 142 can be formed to be less than the thickness d2 of the second gate insulating layer 142. Accordingly, the storage capacitance of the storage capacitor maximized.

The interlayer insulating layer 160 covering the data wires 171, 172, 174, 175, 178, and 179 and the second gate insulating layer 142 is formed thereon. The passivation layer 180 covering the interlayer insulating layer 160 is formed thereon. The pixel electrode 191 and the initialization voltage line 193 are formed on the passivation layer 180. The third data connecting member is connected to the pixel electrode 171 through the contact hole 81 formed in the passivation layer 180. The second data connecting member 175 is connected to the initialization voltage line 192 through the passivation layer 180.

The pixel definition layer 350 covering the passivation layer 180, the initialization voltage line 192, and the edge of the pixel electrode 191 is formed thereon. The pixel definition layer 350 has the pixel opening 351 exposing the pixel electrode 191. The organic emission layer 370 is formed on the pixel electrode 191 exposed by the pixel opening 351, and the common electrode 270 is formed on the organic emission layer 370.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic, light-emitting diode (OLED) display, comprising:
   a substrate;
   a scan line formed over the substrate;
   a data line and a driving voltage line formed over the substrate and the scan line;
   a switching transistor that includes a switching gate electrode electrically connected to the scan line, a switching source electrode electrically connected to the data line and a switching drain electrode;
   a driving transistor that includes a driving gate electrode, a driving drain electrode, and a driving source electrode;
   a storage capacitor that includes a first storage electrode and a second storage electrode;
   an OLED electrically connected to the driving drain electrode;
   a connecting member disposed on a same layer as the driving gate electrode,
   wherein the driving voltage line includes a first driving voltage line that extends in a first direction substantially parallel to an extending direction of the data line and a second driving voltage line that extends in a second direction crossing the first direction, wherein the first driving voltage line in the first direction and the second driving voltage line in the second direction are formed as a whole,
   wherein the data line includes a first data line and a second data line separated from the first data line,
   wherein the connecting member electrically connects the first data line to the second data line,
   wherein a bottom surface of the first driving voltage line and a bottom surface of the second driving voltage line directly contact a same layer,
   wherein the first data line and the second data line are disposed at a same layer as the second driving voltage line, and the connecting member crosses and overlaps the second driving voltage line, and
   wherein the bottom surface of the connecting member directly contacts a same layer as a bottom surface of the switching gate electrode and the driving gate electrode.

2. The display of claim 1, further comprising:
   a semiconductor layer disposed on the substrate and including a switching channel and a driving channel separated from each other; and
   a first gate insulating layer at least partially covering the semiconductor layer,
   wherein the switching gate electrode and the driving gate electrode are disposed on the first gate insulating layer and at least partially overlapping the switching channel and the driving channel, respectively.

3. The display of claim 2, wherein the second storage electrode and the driving gate electrode at least partially overlap each other.

4. The display of claim 2, wherein the driving channel has at least one curved portion.

5. The display of claim 2, further comprising:
   a second gate insulating layer that at least partially covers the switching gate electrode, the driving gate electrode, and the connecting member;
   an interlayer insulating layer that at least partially covers the data line and the driving voltage line; and
   a passivation layer formed between the interlayer insulating layer and the OLED,
   wherein the data line and the driving voltage line are formed between the second gate insulating layer and the interlayer insulating layer.

6. The display of claim 2, further comprising:
   an initialization voltage line; and
   a transistor that initializes an anode of the OLED and that includes a gate electrode, a source electrode connected to the anode of the OLED, and a drain electrode connected to the initialization voltage line.

7. The display of claim 6, further comprising:
   a control line connected to the gate electrode of the transistor that initializes the anode of the OLED and that extends in the first direction.

8. An organic light-emitting diode (OLED) display comprising:
   a substrate;
   a data line and a driving voltage line each formed over the substrate;
   a driving transistor that includes a driving drain electrode, a driving gate electrode, and a driving source electrode;
   a storage capacitor that includes a first storage electrode and a second storage electrode;
   an OLED electrically connected to the driving drain electrode;
   a connecting member disposed on a same layer as the driving gate electrode,
   wherein the driving voltage line includes a first driving voltage line that extends in a first direction substantially parallel to an extending direction of the data line and a second driving voltage line that extends in a second direction crossing the first direction, wherein the first driving voltage line in the first direction and the second driving voltage line in the second direction are connected to and cross each other and form a mesh structure,
   wherein the data line includes a first data line and a second data line separated from the first data line,
   wherein the connecting member electrically connects the first data line to the second data line, wherein a bottom surface of the first driving voltage line and a bottom surface of the second driving voltage line directly contact a same layer, wherein the first data line and the second data line are disposed at a same layer as the second driving voltage line, and the connecting member crosses and overlaps the second driving voltage line, and wherein the bottom surface of the connecting member directly contacts a same layer as a bottom surface of the driving gate electrode.

9. The display of claim 8, further comprising:
a semiconductor layer disposed on the substrate and including a driving channel; and
a first gate insulating layer at least partially covering the semiconductor layer;
wherein the driving gate electrode disposed on the first gate insulating layer and at least partially overlapping the driving channel.

10. The display of claim 9, further comprising:
a second gate insulating layer that at least partially covers the driving gate electrode, and the connecting member;
an interlayer insulating layer that at least partially covers the data line and the driving voltage line; and
a passivation layer formed between the interlayer insulating layer and the OLED,
wherein the data line and the driving voltage line are formed between the second gate insulating layer and the interlayer insulating layer.

11. The display of claim 10, wherein the second storage electrode and the driving gate electrode at least partially overlap each other.

12. The display of claim 10, herein the driving channel has at least one curved portion.

13. The display of claim 10, further comprising:
a initialization voltage line; and
a transistor that initializes an anode of the OLED and that includes a gate electrode, a source electrode connected to the anode of the OLED, and a drain electrode connected to the initialization voltage line.

14. The display of claim 13, further comprising:
a control line connected, to the gate electrode of the transistor that initializes the anode of the OLED and that extends in the first direction.

\* \* \* \* \*